(12) United States Patent
Suzaki et al.

(10) Patent No.: US 11,502,259 B2
(45) Date of Patent: Nov. 15, 2022

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Yuji Suzaki, Yokohama (JP); Akinori Yamatani, Yokohama (JP); Nobutaka Akashi, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 485 days.

(21) Appl. No.: 16/739,698

(22) Filed: Jan. 10, 2020

(65) Prior Publication Data
US 2020/0287138 A1    Sep. 10, 2020

(30) Foreign Application Priority Data
Mar. 5, 2019 (KR) .................. 10-2019-0025427

(51) Int. Cl.
| | |
|---|---|
| *H01L 51/50* | (2006.01) |
| *H01L 51/00* | (2006.01) |
| *C07F 5/02* | (2006.01) |
| *C09K 11/06* | (2006.01) |

(52) U.S. Cl.
CPC ............ *H01L 51/008* (2013.01); *C07F 5/027* (2013.01); *C09K 11/06* (2013.01); *C09K 2211/1018* (2013.01); *H01L 51/5012* (2013.01); *H01L 51/5016* (2013.01)

(58) Field of Classification Search
None
See application file for complete search history.

(56) References Cited

U.S. PATENT DOCUMENTS

| | | |
|---|---|---|
| 5,932,393 A | 8/1999 | Cunningham et al. |
| 2003/0157366 A1 | 8/2003 | Matsuura et al. |
| 2011/0278556 A1 | 11/2011 | Kottas et al. |
| 2011/0279019 A1 | 11/2011 | Kottas et al. |
| 2014/0014922 A1 | 1/2014 | Lin et al. |
| 2018/0069182 A1 | 3/2018 | Hatakeyama et al. |
| 2018/0094000 A1 | 4/2018 | Hatakeyama et al. |

(Continued)

FOREIGN PATENT DOCUMENTS

| | | |
|---|---|---|
| CN | 106467553 A | 3/2017 |
| CN | 106467554 A | 3/2017 |

(Continued)

OTHER PUBLICATIONS

Wu et. al., Steric Switching for Thermally Activated Delayed Fluorescence by Controlling the Dihedral Angles between Donor and Acceptor in Organoboron Emitters; CS Applied Materials & Interfaces (2019), 11(11), 10768-10776 (Year: 2019).*

*Primary Examiner* — Gregory D Clark
(74) *Attorney, Agent, or Firm* — Lewis Roca Rothgerber Christie LLP

(57) ABSTRACT

An organic electroluminescence device having high luminous efficiency includes a first electrode, a hole transport region on the first electrode, an emission layer on the hole transport region, an electron transport region on the emission layer, and a second electrode on the electron transport region, wherein the emission layer includes a polycyclic compound represented by Formula 1.

20 Claims, 2 Drawing Sheets

(56) References Cited

U.S. PATENT DOCUMENTS

| | | | |
|---|---|---|---|
| 2018/0301629 | A1 | 10/2018 | Hatakeyama et al. |
| 2019/0027694 | A1 | 1/2019 | Hatakeyama et al. |
| 2019/0058124 | A1 | 2/2019 | Hatakeyama et al. |
| 2019/0115537 | A1 | 4/2019 | Makishima et al. |

FOREIGN PATENT DOCUMENTS

| | | |
|---|---|---|
| CN | 107266484 A | 10/2017 |
| CN | 107417715 A | 12/2017 |
| CN | 107501311 A | 12/2017 |
| DE | 19648256 A1 | 5/1997 |
| JP | 4428772 B2 | 3/2010 |
| JP | 4810687 B2 | 11/2011 |
| JP | 2016-036022 A | 3/2016 |
| JP | 2017-126606 A | 7/2017 |
| JP | 2018-061028 A | 4/2018 |
| JP | 2018-061029 A | 4/2018 |
| JP | 2018-061030 A | 4/2018 |
| KR | 10-0915271 B1 | 9/2009 |
| KR | 10-2014-0103842 A | 8/2014 |
| KR | 10-1785755 B1 | 10/2017 |
| KR | 10-2018-0046851 A | 5/2018 |
| WO | WO 2011/143563 A2 | 11/2011 |
| WO | WO 2016/152418 A1 | 9/2016 |
| WO | WO 2016/152544 A1 | 9/2016 |
| WO | WO 2015/02118 A1 | 3/2017 |
| WO | WO 2017/126443 A1 | 7/2017 |
| WO | WO 2017/138526 A1 | 8/2017 |
| WO | WO 2017/188111 A1 | 11/2017 |
| WO | WO 2017/195669 A1 | 11/2017 |
| WO | WO 2018/047639 A1 | 3/2018 |
| WO | WO 2018/062278 A1 | 4/2018 |

\* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0025427, filed on Mar. 5, 2019, the entire contents of which are hereby incorporated by reference.

BACKGROUND

Embodiments of the present disclosure herein relate to an organic electroluminescence device and a polycyclic compound for an organic electroluminescence device.

Recently, the development of an organic electroluminescence display device as an image display device has been actively conducted. Unlike a liquid crystal display device, the organic electroluminescence display device is a self-luminescent display device in which holes and electrons injected from a first electrode and a second electrode are recombined in an emission layer, and a light emission material, which is an organic compound included in the emission layer, emits light to realize a display.

In the application of an organic electroluminescence device to a display device, the organic electroluminescence device should have a low driving voltage, high luminous efficiency and a long life-time, and accordingly development on materials for an organic electroluminescence device capable of stably realizing the requirements is continuously being conducted.

For example, to realize an organic electroluminescence device having high efficiency, in recent years, technology relating to phosphorescence emission using a triplet state energy or delayed fluorescence emission using triplet-triplet annihilation (TTA), which is a phenomenon of generating a singlet exciton by collision of a triplet exciton excitation, has been developed, and development of a thermally activated delayed fluorescence (TADF) material using the delayed fluorescence phenomenon is actively being conducted.

SUMMARY

Embodiments of the present disclosure provide an organic electroluminescence device having a long life-time and high efficiency, and a polycyclic compound used therefor.

Embodiments of the present disclosure also provide an organic electroluminescence device including a thermally activated delayed fluorescence emission material and a polycyclic compound used as a thermally activated delayed fluorescence emission material.

An embodiment of the present disclosure provides an organic electroluminescence device including: a first electrode; a hole transport region on the first electrode; an emission layer on the hole transport region; an electron transport region on the emission layer; and a second electrode on the electron transport region, wherein the emission layer includes a polycyclic compound represented by Formula 1 below:

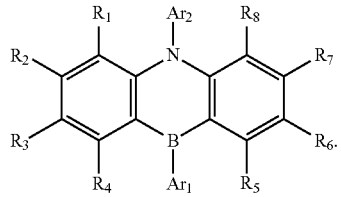

Formula 1

In Formula 1 above: $Ar_1$ and $Ar_2$ may each independently be a substituted or unsubstituted aryl ring having 6 to 30 carbon atoms for forming a ring, or a substituted or unsubstituted heteroaryl ring having 2 to 30 carbon atoms for forming a ring; and $R_1$ to $R_8$ may each independently be a hydrogen atom, a deuterium atom, a halogen atom, a substituted or unsubstituted amino group, a cyano group, a boron group, a carbonyl group, a silyl group, an oxy group, a phosphine oxide group, a phosphine sulfide group, a substituted or unsubstituted thiol group, a sulfonyl group, a substituted or unsubstituted alkyl group having 1 to 20 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, or $R_1$ to $R_8$ may be combined with each other to form a ring, and at least two selected from $R_1$ to $R_8$ may be represented by Formula 2 below:

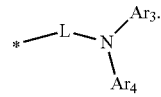

Formula 2

In Formula 2 above: L may be a direct bond, a substituted or unsubstituted arylene group having 6 to 30 carbon atoms for forming a ring, or a substituted or unsubstituted heteroarylene group having 2 to 30 carbon atoms for forming a ring, or may be combined with an adjacent group to form a ring; and $Ar_3$ and $Ar_4$ may each independently be a substituted or unsubstituted aryl group having 6 to 30 carbon atoms for forming a ring, or a substituted or unsubstituted heteroaryl group having 2 to 30 carbon atoms for forming a ring, or may be combined with adjacent groups to form a ring.

In an embodiment, the emission layer may be configured to emit delayed fluorescence.

In an embodiment, the emission layer may be a delayed fluorescence emission layer including a host and a dopant, and the dopant may be the polycyclic compound.

In an embodiment, the emission layer may be a thermally activated delayed fluorescence emission layer configured to emit blue light.

In Formula 1, $Ar_1$ may be represented by Formula 3 below:

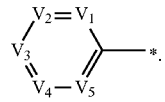

Formula 3

In Formula 3 above, $V_1$ to $V_5$ may each independently be N or $CR_9$, wherein $R_9$ may be a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 1 to 20 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, or may be combined with an adjacent group to form a ring.

In Formula 3, at least one selected from $V_1$ and $V_5$ may be $CR_{10}$, wherein $R_{10}$ may be a substituted or unsubstituted alkyl group having 2 to 20 carbon atoms.

In Formula 2, $Ar_3$ may be a substituted aryl group having 6 to 30 carbon atoms for forming a ring, or a substituted or unsubstituted heteroaryl group having 2 to 30 carbon atoms for forming a ring.

In Formula 1, at least one selected from $R_1$ to $R_4$ may be represented by Formula 2, and at least one selected from $R_5$ to $R_8$ may be represented by Formula 2.

In an embodiment, Formula 1 above may be represented by Formula 4 below:

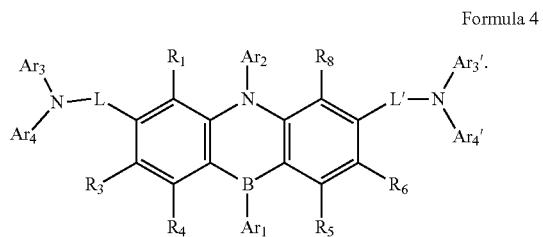

Formula 4

In Formula 4 above: L' may be a direct bond, a substituted or unsubstituted arylene group having 6 to 30 carbon atoms for forming a ring, or a substituted or unsubstituted heteroarylene group having 2 to 30 carbon atoms for forming a ring; $Ar_3'$ and $Ar_4'$ may each independently be a substituted or unsubstituted aryl group having 6 to 30 carbon atoms for forming a ring, or a substituted or unsubstituted heteroaryl group having 2 to 30 carbon atoms for forming a ring, or may be combined with adjacent groups to form a ring; and $Ar_1$ to $Ar_4$, $R_1$, $R_3$ to $R_6$, $R_8$, and L may be the same as defined with respect to Formula 1 or Formula 2.

In Formula 4, at least one selected from L and L' may be a substituted or unsubstituted arylene group having 6 to 30 carbon atoms for forming a ring, or a substituted or unsubstituted heteroarylene group having 2 to 30 carbon atoms for forming a ring.

In Formula 4, L and L' may each independently be a direct bond.

In an embodiment, the compound represented by Formula 1 above may be any one selected from compounds represented by Compound Group 1 below.

In an embodiment, the first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides of one or more selected from them.

In an embodiment of the present disclosure, a polycyclic compound is represented by Formula 1.

BRIEF DESCRIPTION OF THE FIGURES

The accompanying drawings are included to provide a further understanding of embodiments of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
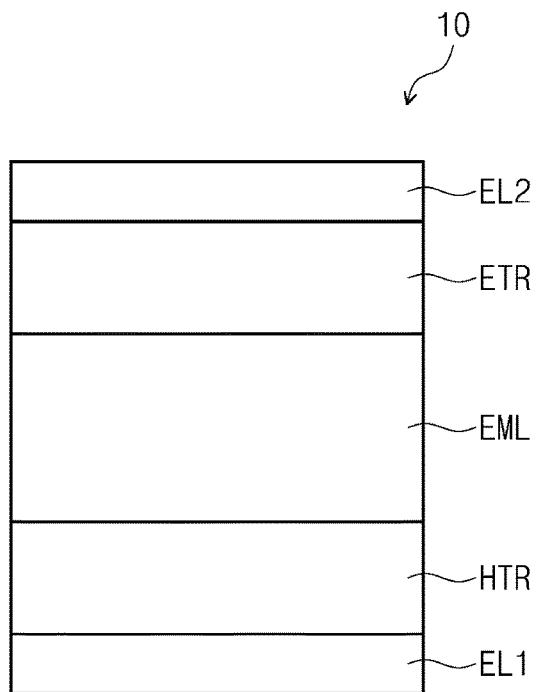
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, the present disclosure is intended to cover all modifications, equivalents, and substituents which are included in the spirit and technical scope of the appended claims, and equivalents thereof.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. For example, a first element could be termed a second element without departing from the spirit and scope of the present disclosure. Similarly, a second element could be termed a first element. As used herein, the singular forms are intended to include the plural forms as well, unless the context clearly indicates otherwise.

In the present description, it should be understood that the term "comprise" or "have" intends to mean that there may be specified features, numerals, steps, operations, elements, parts, or combinations thereof, not excluding the possibility of the presence or addition of the specified features, numerals, steps, operations, elements, parts, or combinations thereof. It will also be understood that when a layer, a film, a region, a plate, etc. is referred to as being "on" another part, it can be "directly on" the other part, or intervening layers may also be present. In addition, it will also be understood that when an element or layer is referred to as being "between" two elements or layers, it can be the only element or layer between the two elements or layers, or one or more intervening elements or layers may also be present.

In the present description, ———— * means a connecting position.

In the present description, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents exemplified above may be substituted or unsubstituted. For example, a biphenyl group may be interpreted as an aryl group or a phenyl group substituted with a phenyl group.

In the description, the expression "being combined with an adjacent group to form a ring" may mean being combined with an adjacent group to form a substituted or unsubstituted hydrocarbon ring, or a substituted or unsubstituted heterocyclic ring. The hydrocarbon ring includes an aliphatic hydrocarbon ring and an aromatic hydrocarbon ring. The heterocyclic ring includes an aliphatic heterocyclic ring and an aromatic heterocyclic ring. The hydrocarbon ring and heterocyclic ring may be a monocyclic ring or a polycyclic ring. In addition, the ring formed by being combined with an adjacent group may be connected to another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the present description, the halogen atom may be, for example, a fluorine atom, a chlorine atom, a bromine atom, or an iodine atom.

In the present description, the alkyl group may be a linear, branched, or cyclic type (e.g., a linear, branched, or cyclic alkyl group). The number of carbon atoms of the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, or the like, but the present disclosure is not limited thereto.

In the present description, the term "aryl group" means an optional functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, or the like, but the present disclosure is not limited thereto.

In the present description, the fluorenyl group may be substituted, and two substituents may be combined with each other to form a spiro structure. Examples of a substituted fluorenyl group are as follows, but the present disclosure is not limited thereto.

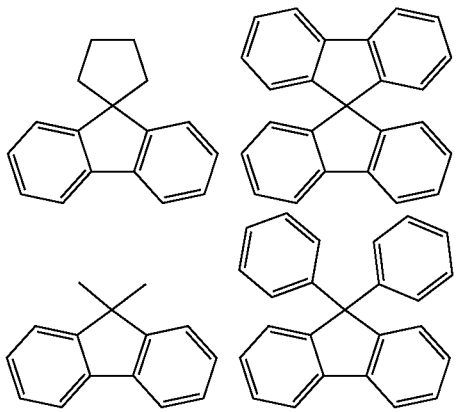

In the present description, the heteroaryl group may be a heteroaryl group including one or more of O, N, P, Si, or S as a heteroatom. The number of ring-forming carbon atoms in the heteroaryl group may be 2 to 30 or 2 to 20. The heteroaryl group may be a monocyclic heteroaryl group or a polycyclic heteroaryl group. The polycyclic heteroaryl group may have, for example, a bicyclic structure or a tricyclic structure. Examples of the heteroaryl group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazolinyl group, a quinoxalinyl group, a phenoxazyl group, a phthalazinyl group, a pyrido pyrimidinyl group, a pyrido pyrazinyl group, a pyrazino pyrazinyl group, an isoquinolinyl group, indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophenyl group, a dibenzothiophenyl group, a thienothiophenyl group, a benzofuranyl group, a phenanthrolinyl group, a thiazolyl group, an isooxazolyl, an oxadiazolyl group, a thiadiazolyl group, a benzothiazolyl group, a phenothiazinyl group, a dibenzosilole group, a dibenzofuranyl group, or the like, but the present disclosure is not limited thereto.

In the present description, the silyl group includes an alkylsilyl group and an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, or the like, but the present disclosure is not limited thereto.

In the present description, the number of carbon atoms of the amine group is not particularly limited, but may be 1 to 30. The amine group may include an alkylamine group or an arylamine group. Examples of the amine group may include a methylamine group, a dimethylamine group, a phenylamine group, a naphthylamine group, a 9-methyl-anthracenylamine group, a triphenylamine group, or the like, but the present disclosure is not limited thereto.

In the present description, the explanation of the described aryl group may also be applied except that the arylene group is a divalent group.

In the present description, the explanation of the described heteroaryl group may also be applied except that the heteroarylene group is a divalent group.

Hereinafter, an organic electroluminescence device according to an embodiment of the present disclosure will be explained with reference to FIGS. 1 to 3.

An organic electroluminescence device according to an embodiment of the present disclosure will be explained with reference to FIGS. 1 to 3.

FIG. 1 is a cross-sectional view schematically illustrating an organic electroluminescence device according to an embodiment of the present disclosure. FIG. 2 is a cross-sectional view schematically illustrating an organic electroluminescence device according to an embodiment of the present disclosure. FIG. 3 is a cross-sectional view schematically illustrating an organic electroluminescence device according to an embodiment of the present disclosure.

Figure 2:
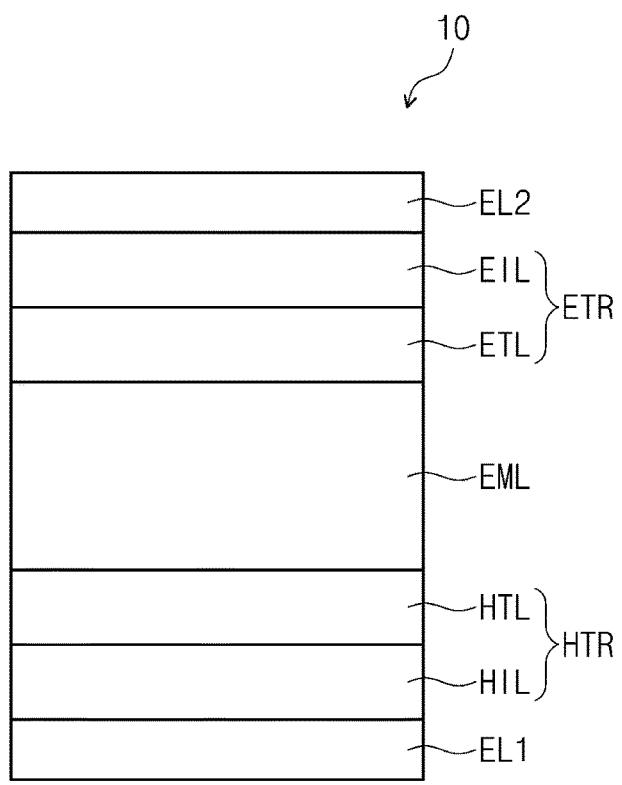
FIG. 2 is a cross-sectional view schematically illustrating an organic electroluminescence device according to an embodiment of the present disclosure.
Figure 3:
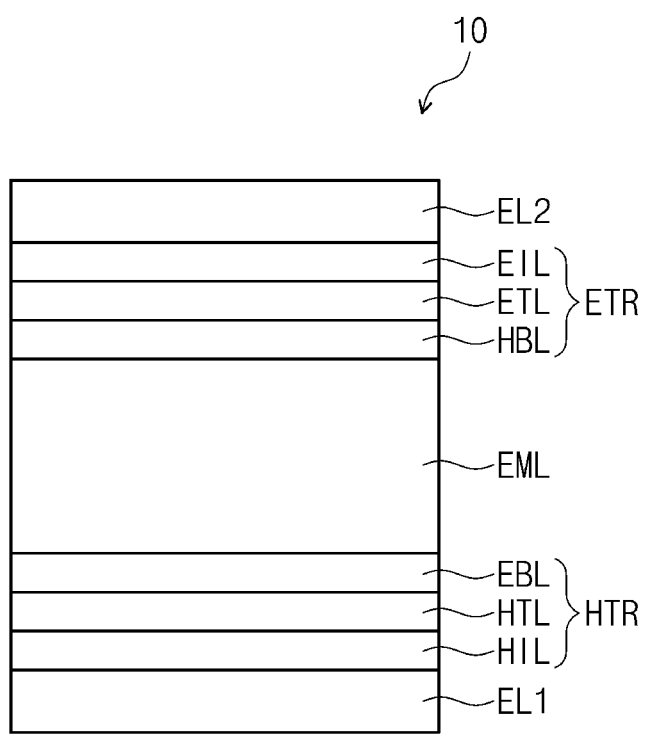
FIG. 3 is a cross-sectional view schematically illustrating an organic electroluminescence device according to an embodiment of the present disclosure.

Referring to FIGS. 1 to 3, an organic electroluminescence device 10 according to an embodiment may include a first electrode EL1, a hole transport region HTR, an emission layer EML, an electron transport region ETR, and a second electrode EL2, which are sequentially laminated.

The first electrode EL1 and the second electrode EL2 may be located to face each other, and a plurality of organic layers may be between the first electrode EL1 and the second electrode EL2. The plurality of organic layers may include a hole transport region HTR, an emission layer EML, and an electron transport region ETR. The organic electroluminescence device 10 of an embodiment may include an embodiment of a polycyclic compound of the present disclosure in the emission layer EML.

As compared with FIG. 1, FIG. 2 illustrates a cross-sectional view of an organic electroluminescence device 10 according to an embodiment in which a hole transport region HTR includes a hole injection layer HIL and a hole transport layer HTL and an electron transport region ETR includes an electron injection layer EIL and an electron transport layer ETL. In addition, as compared with FIG. 1, FIG. 3 illustrates a cross-sectional view of an organic electroluminescence device 10 according to an embodiment in which a hole transport region HTR includes a hole injection layer HIL, a hole transport layer HTL, and an electron blocking layer EBL and an electron transport region ETR includes an electron injection layer EIL, an electron transport layer ETL, and a hole blocking layer HBL.

An organic electroluminescence device 10 of an embodiment illustrated in FIGS. 1 to 3 may include a polycyclic compound of an embodiment containing one electron donor and one electron acceptor in at least one organic layer selected from the plurality of organic layers. In the polycyclic compound of an embodiment, the electron donor may include an azaborine portion and the electron acceptor may include any one selected from a cyano group, a carbonyl group, a boron group, a sulfonyl group, a sulfinyl group, a phosphine oxide group, a nitrogen-containing five-membered ring, and a nitrogen-containing six-membered monocyclic ring.

In an organic electroluminescence device 10 of an embodiment, the first electrode EL1 may have conductivity (e.g., electrical conductivity). The first electrode EL1 may be formed of a metal alloy or a conductive compound. The first electrode EL1 may be an anode.

The first electrode EL1 may be a transmissive electrode, a transflective electrode, or a reflective electrode. When the first electrode EL1 is a transmissive electrode, the first electrode EL1 may be formed of a transparent metal oxide, for example, indium tin oxide (ITO), indium zinc oxide (IZO), zinc oxide (ZnO), indium tin zinc oxide (ITZO), or the like. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the first electrode EL1 may have a structure which has a plurality of layers including: a reflective layer or a transflective layer formed of any of the materials described herein; and a transparent conductive layer formed of ITO, IZO, ZnO, ITZO, or the like. For example, the first electrode EL1 may have a multi-layered structure of ITO/Ag/ITO.

A thickness of the first electrode EL1 may be about 1000-10000 Å, for example, about 1000-3000 Å.

The hole transport region HTR may be on the first electrode EL1. The hole transport region HTR may include at least one of a hole injection layer HIL, a hole transport layer HTL, a hole buffer layer, or an electron blocking layer EBL.

The hole transport region HTR may have a structure of: a single layer formed of a single material; a single layer formed of a plurality of different materials; or a multi-layer having a plurality of layers formed of a plurality of different materials.

For example, the hole transport region HTR may have a structure of a single layer which is a hole injection layer HIL or a hole transport layer HTL, or may have a structure of a single layer formed of a hole injection material and a hole transport material. In some embodiments, the hole transport region HTR may have a structure of a single layer formed of a plurality of different materials, or may have a structure of, sequentially laminated from the first electrode EL1, hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, but the present disclosure is not limited thereto.

The hole transport region HTR may be formed by using various suitable methods such as, for example, a vacuum deposition method, a spin coating method, a casting method, a Langmuir-Blodgett (LB) method, an inkjet printing method, a laser printing method, or a laser induced thermal imaging (LITI) method.

The hole injection layer HIL according to an organic electroluminescence device 10 of an embodiment may include any suitable hole injection material such as, for example, triphenylamine-containing polyetherketone (TPA- PEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4''-tris(N,N-diphenylamino)triphenylamine (TDATA), 4,4',4''-tris(N,N-2-naphthylphenylamino)triphenylamine (2-TNATA), polyaniline/dodecylbenzene sulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), dipyrazino[2,3-f:2',3'-h]quinoxaline-2,3,6,7,10,11-hexacarbonitrile (HAT-CN), or the like, but the present disclosure is not limited thereto.

The hole transport layer HTL may include any suitable material available in the art. In some embodiments, the hole transport layer HTL may include, for example, 1,1-bis[(di-4-tolylamino)phenyl]cyclohexane (TAPC), a carbazole derivative such as N-phenylcarbazole and polyvinylcarbazole, N,N'-bis(3-methylphenyl)-N,N'-diphenyl-(1,1-biphenyl)-4,4'-diamine (TPD), 4,4',4''-tris(N-carbazolyl)triphenylamine (TCTA), N,N'-di(1-naphthyl)-N,N'-diphenylbenzidine (NPB), N,N'-bis(1-naphthyl)-N,N'-diphenyl-4,4'-diamine (α-NPD), or the like, but the present disclosure is not limited thereto. In some embodiments, the hole transport region HTR may further include an electron blocking layer EBL, and the electron blocking layer EBL may be between the hole transport layer HTL and the emission layer EML. The electron blocking layer EBL may serve to prevent or reduce electron injection from the electron transport region ETR to the hole transport region HTR.

The electron blocking layer EBL may include, for example, a carbazole-based derivative such as N-phenylcarbazole and polyvinylcarbazole, a fluorine-based derivative, a triphenylamine-based derivative such as N,N'-bis(3-methylphenyl)-N,N'-diphenyl-(1,1-biphenyl)-4,4'-diamine (TPD) and 4,4',4''-tris(N-carbazolyl)triphenylamine (TCTA), N,N'-di(naphthalene-1-yl)-N,N'-diphenyl-benzidine (NPB), 4,4'-cyclohexylidene-bis[N,N-bis(4-methylphenyl)benzenamine] (TAPC), 4,4'-bis[N,N-(3-tolyl)amino]-3,3'-dimethylbiphenyl (HMTPD), mCP, or the like.

A thickness of the hole transport region HTR may be about 100-10000 Å, for example, about 100-5000 Å. A thickness of the hole injection layer HIL may be, for example, about 30-1000 Å, and a thickness of the hole transport layer HTL may be about 30-1000 Å. A thickness of the electron blocking layer EBL may be, for example, about 10-1000 Å. When the thicknesses of the hole transport region HTR, the hole injection layer HIL, the hole transport layer HTL, and the electron blocking layer EBL satisfy the described ranges, suitable or satisfactory hole transport performance may be achieved without substantial rise of a driving voltage.

The hole transport region HTR may further include a charge-generating material in addition to the described materials to improve conductivity (e.g., electrical conductivity). The charge-generating material may be uniformly or non-uniformly (heterogeneously) dispersed in the hole transport region HTR. The charge-generating material may be, for example, a p-dopant. The p-dopant may be one of a quinone derivative, a metal oxide, or a cyano group-containing compound, but the present disclosure is not limited thereto. The non-limited examples of the p-dopant may be, for example, a quinone derivative (such as tetracyanoquinodimethane (TCNQ) and 2,3,5,6-tetrafluoro-tetracyanoquinodimethane (F4-TCNQ)), a metal oxide (such as a tungsten oxide and a molybdenum oxide), or the like, but the present disclosure is not limited thereto.

As described herein, the hole transport region HTR may further include at least one of the hole buffer layer or the electron blocking layer EBL in addition to the hole injection layer HIL and the hole transport layer HTL. The hole buffer layer may improve luminous efficiency by compensating for a resonance distance depending on the wavelength of the light emitted from the emission layer EML. The materials contained in the hole transport region HTR may also be used as materials contained in the hole buffer layer.

The emission layer EML may be on the hole transport region HTR. A thickness of the emission layer EML may be, for example, about 100-600 Å. The emission layer EML may have a structure of: a single layer formed of a single material; a single layer formed of a plurality of different materials; or a multi-layer having a plurality of layers formed of a plurality of different materials.

The emission layer EML may be formed by using various suitable methods such as, for example, a vacuum deposition method, a spin coating method, a casting method, a Langmuir-Blodgett (LB) method, an inkjet printing method, a laser printing method, and a laser induced thermal imaging (LITI) method.

The emission layer EML may be configured to emit one of red light, green light, blue light, white light, yellow light, or cyan light. The emission layer EML may include a fluorescence emission material or a phosphorescence emission material.

In an embodiment, the emission layer EML may be a fluorescence emission layer. For example, some of the light emitted from the emission layer EML may be emitted by thermally activated delayed fluorescence (TADF). For example, the emission layer EML may include emission components configured to emit thermally activated delayed fluorescence, and in an embodiment, the emission layer EML may be a thermally activated delayed fluorescence emission layer configured to emit blue light.

In an embodiment, the emission layer EML may include a polycyclic compound represented by Formula 1 below:

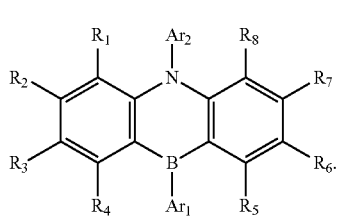

Formula 1

In Formula 1, $Ar_1$ and $Ar_2$ may each independently be a substituted or unsubstituted aryl ring having 6 to 30 carbon atoms for forming a ring, or a substituted or unsubstituted heteroaryl ring having 2 to 30 carbon atoms for forming a ring.

In Formula 1, $R_1$ to $R_8$ may each independently be a hydrogen atom, a deuterium atom, a halogen atom, a substituted or unsubstituted amino group, a cyano group, a boron group, a carbonyl group, a silyl group, an oxy group, a phosphine oxide group, a phosphine sulfide group, a substituted or unsubstituted thiol group, a sulfonyl group, a substituted or unsubstituted alkyl group having 1 to 20 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, or $R_1$ to $R_8$ may be combined with each other to form a ring.

As used herein, the expression "$R_1$ to $R_8$ may be combined with each other to form a ring" means that any adjacent pair of $R_1$ and $R_2$, $R_2$ and $R_3$, $R_3$ and $R_4$, $R_5$ and $R_6$, $R_6$ and $R_7$, or $R_7$ and $R_8$ may be combined with each other to form a ring, and $R_1$ to $R_8$ may not form a ring by bonding with $Ar_1$ and $Ar_2$.

In Formula 1, at least two selected from $R_1$ to $R_8$ may be represented by Formula 2 below:

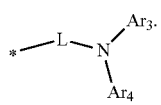

Formula 2

In Formula 2, L may be a direct bond, a substituted or unsubstituted arylene group having 6 to 30 carbon atoms for forming a ring, or a substituted or unsubstituted heteroarylene group having 2 to 30 carbon atoms for forming a ring, or may be combined with an adjacent group to form a ring.

In Formula 2, $Ar_3$ and $Ar_4$ may each independently be a substituted or unsubstituted aryl group having 6 to 30 carbon atoms for forming a ring, or a substituted or unsubstituted heteroaryl group having 2 to 30 carbon atoms for forming a ring, or may be combined with adjacent groups to form a ring.

In an embodiment, $Ar_3$ in Formula 2 may be a substituted aryl group having 6 to 30 carbon atoms for forming a ring, or a substituted or unsubstituted heteroaryl group having 2 to 30 carbon atoms for forming a ring.

In an embodiment, An in Formula 1 may be represented by Formula 3 below:

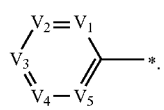

Formula 3

In Formula 3, $V_1$ to $V_5$ may each independently be N or $CR_9$, wherein $R_9$ may be a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 1 to 20 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, or may be combined with an adjacent group to form a ring.

In an embodiment, at least one selected from $V_1$ and $V_5$ in Formula 3 may be $CR_{10}$, wherein $R_{10}$ may be a substituted or unsubstituted alkyl group having 2 to 20 carbon atoms.

In an embodiment, at least one selected from $R_1$ to $R_4$ in Formula 1 may be represented by Formula 2, and at least one selected from $R_5$ to $R_8$ in Formula 1 may be represented by Formula 2.

In an embodiment, two selected from $R_1$ to $R_8$ in Formula 1 may be represented by Formula 2. For example, $R_2$ and $R_7$ in Formula 1 may each independently be represented by Formula 2. In this case, Formula 1 may be represented by Formula 4 below:

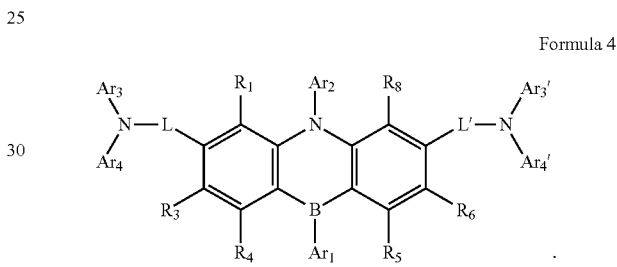

Formula 4

In Formula 4, L' may be a direct bond, a substituted or unsubstituted arylene group having 6 to 30 carbon atoms for forming a ring, or a substituted or unsubstituted heteroarylene group having 2 to 30 carbon atoms for forming a ring.

In Formula 4, $Ar_3'$ and $Ar_4'$ may each independently be a substituted or unsubstituted aryl group having 6 to 30 carbon atoms for forming a ring, or a substituted or unsubstituted heteroaryl group having 2 to 30 carbon atoms for forming a ring, or may be combined with adjacent groups to form a ring.

In Formula 4, $Ar_1$ to $Ar_4$, $R_1$, $R_3$ to $R_6$, $R_8$, and L may be the same as defined with respect to Formula 1 or Formula 2.

In an embodiment, at least one selected from L and L' in Formula 4 may be a substituted or unsubstituted arylene group having 6 to 30 carbon atoms for forming a ring, or a substituted or unsubstituted heteroarylene group having 2 to 30 carbon atoms for forming a ring.

In an embodiment, L and L' in Formula 4 may each independently be a direct bond.

The polycyclic compound of an embodiment represented by Formula 1 may be a delayed fluorescence emission material. The polycyclic compound of an embodiment may be a thermally activated delayed fluorescence material.

The polycyclic compound of an embodiment represented by Formula 1 may be represented by any one selected from compounds represented by Compound Group 1 below:

Compound Group 1
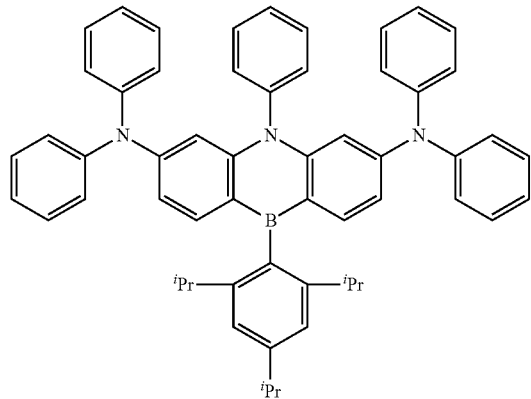
1
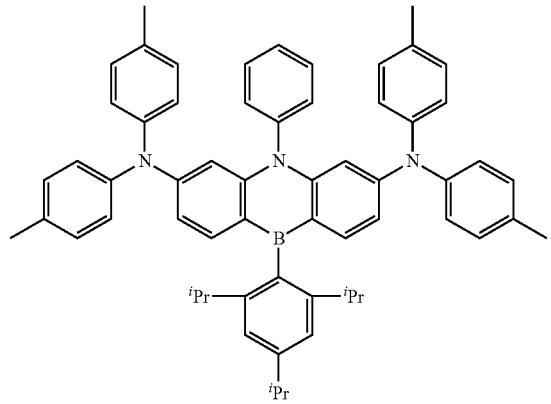
2
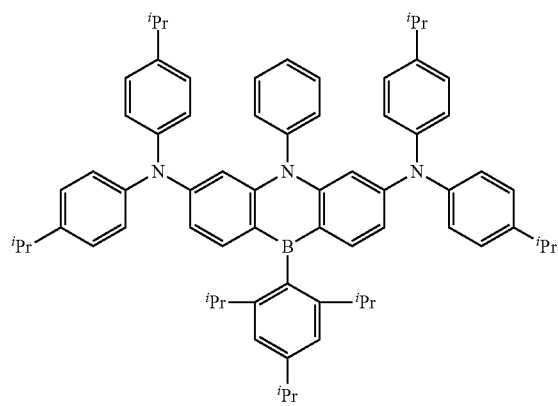
3
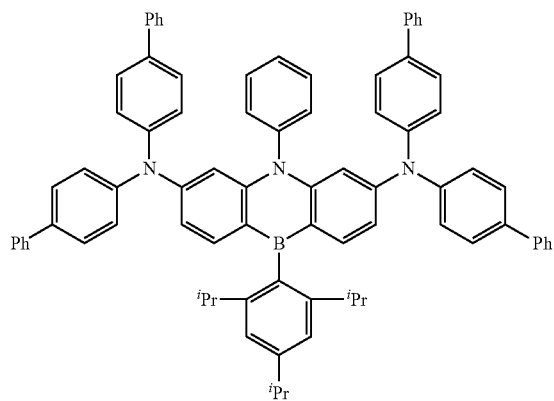
4
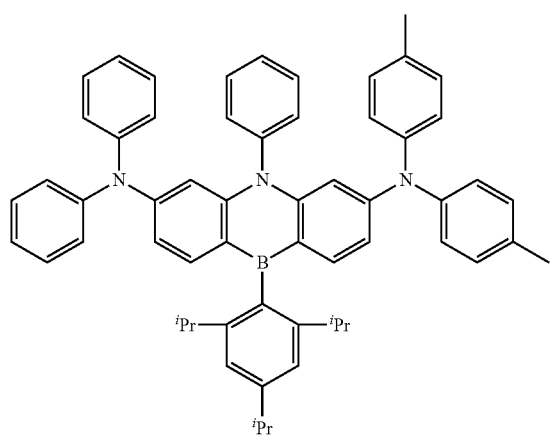
5
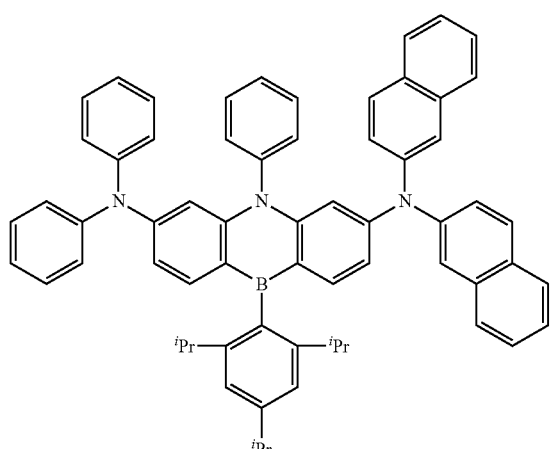
6

-continued
7
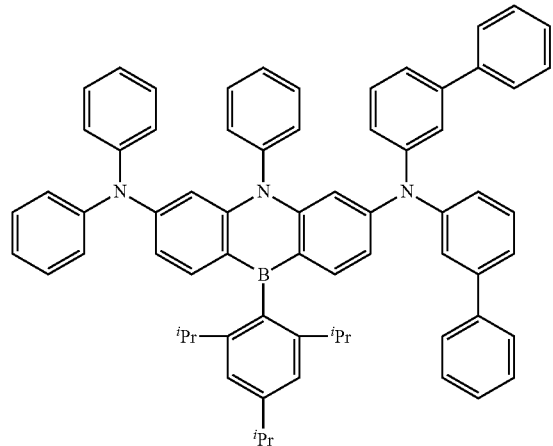
8
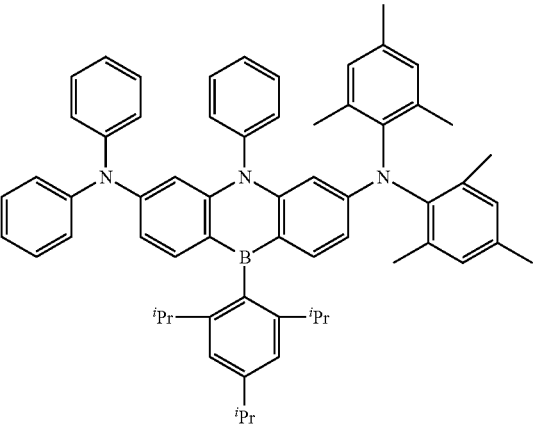
9
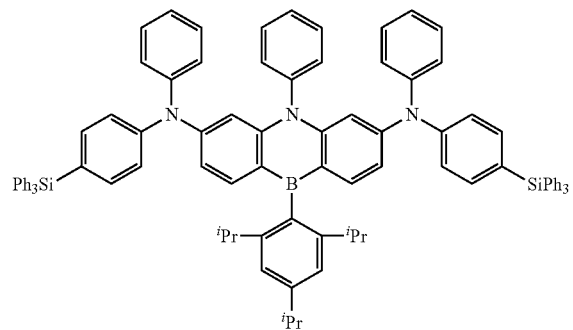
10
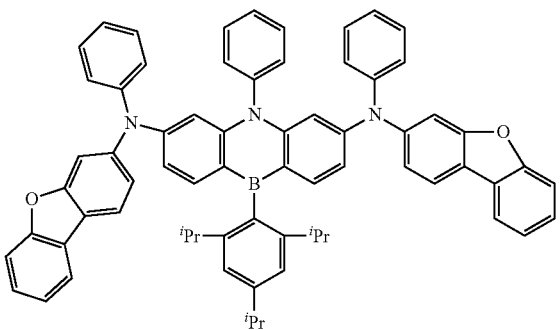
11
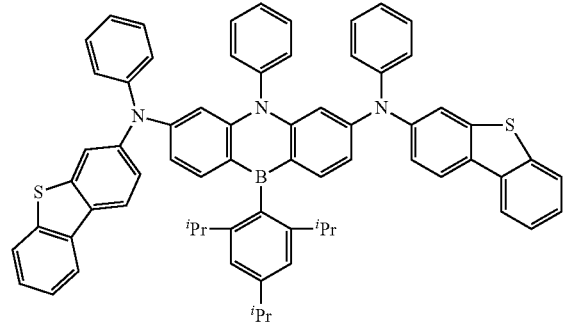
12
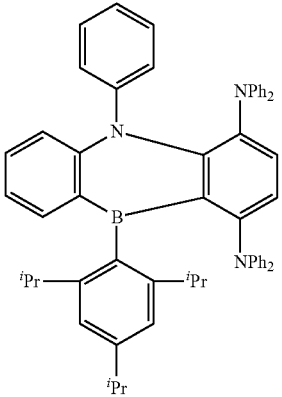
13
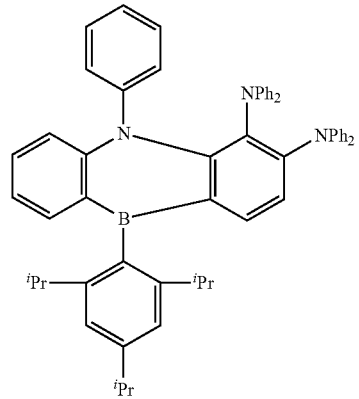
14
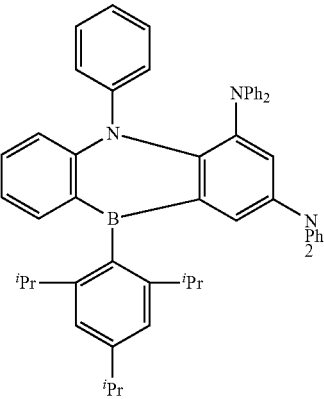

-continued
15
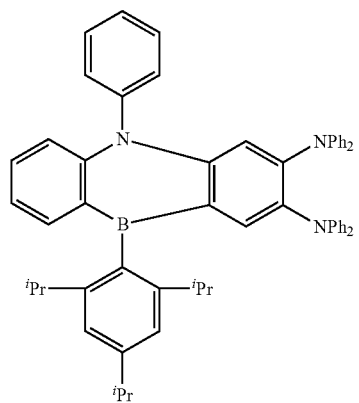
16
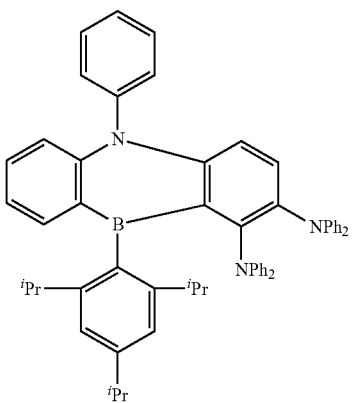
17
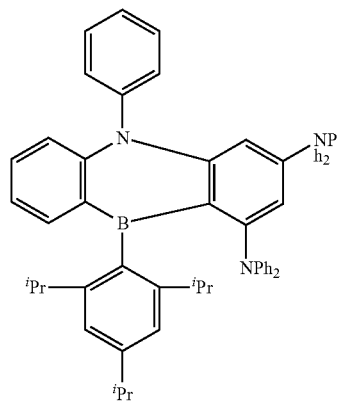
18
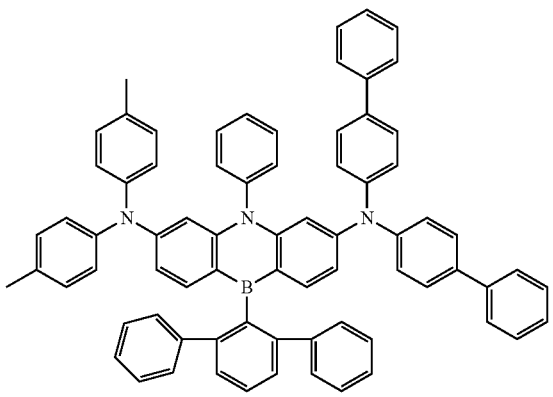
19
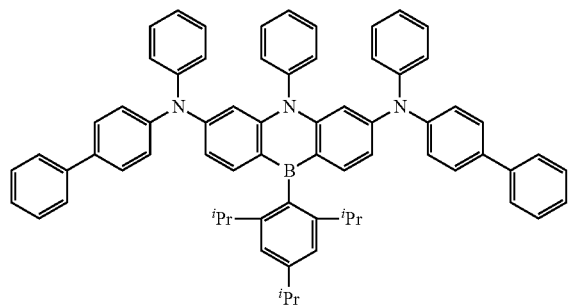
20
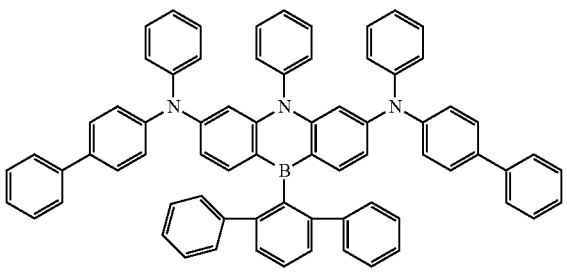
21
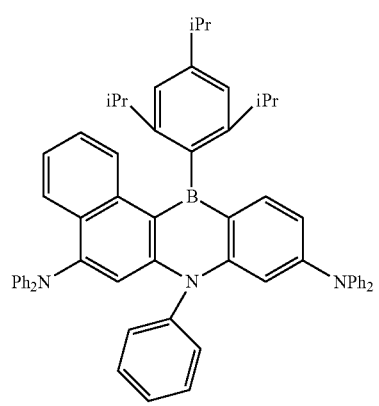
22
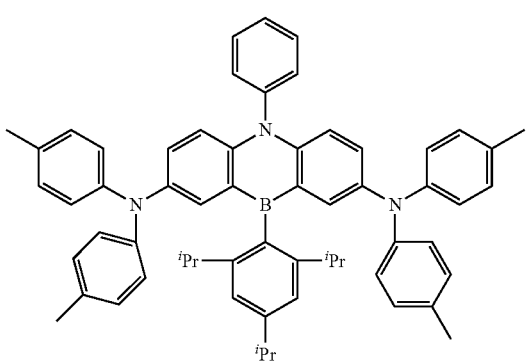

-continued
23
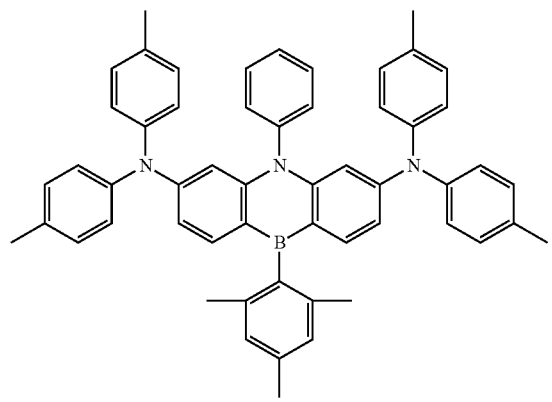
24
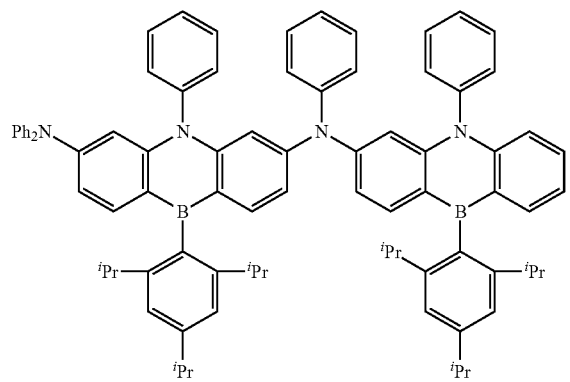
25
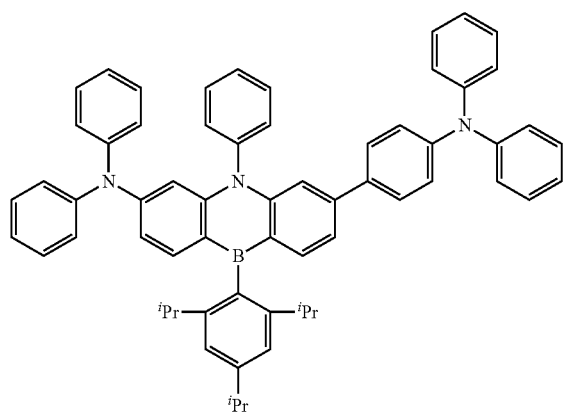
26
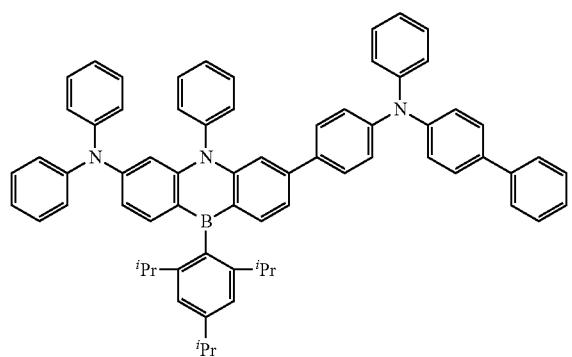
27
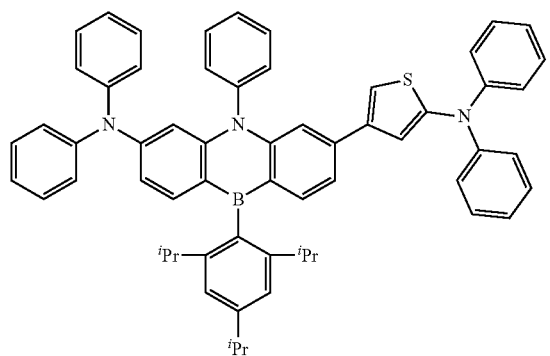
28
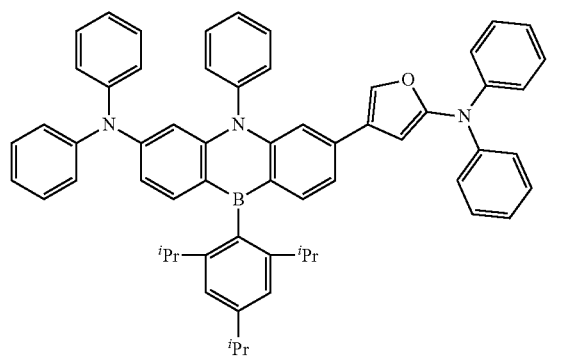
29
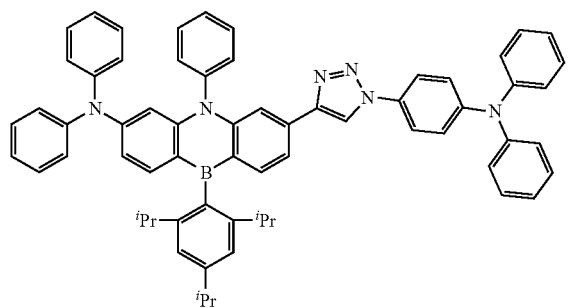
30
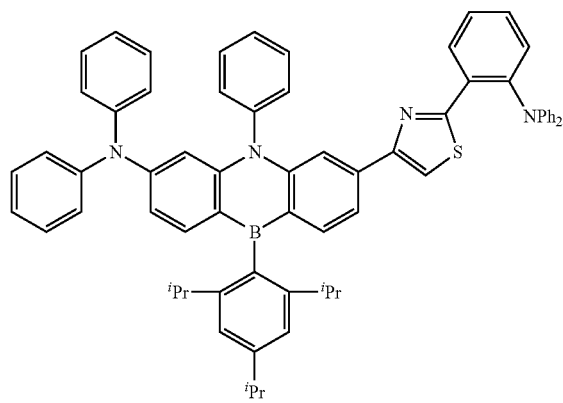

-continued
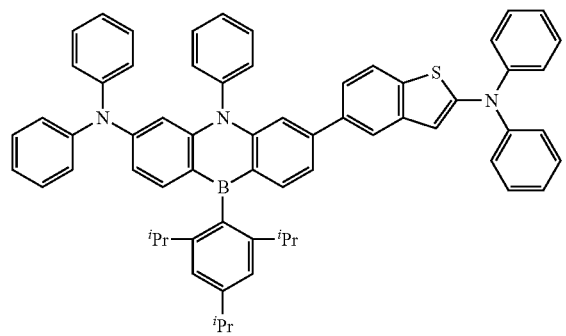
31
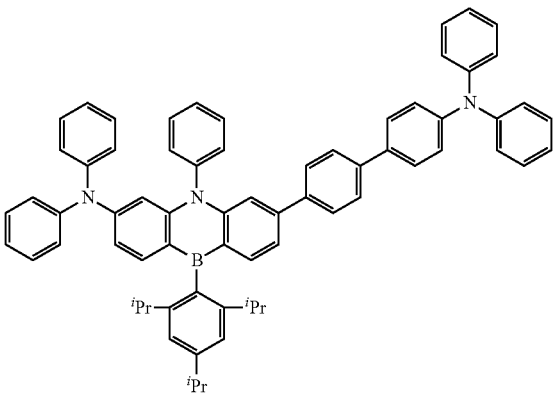
32
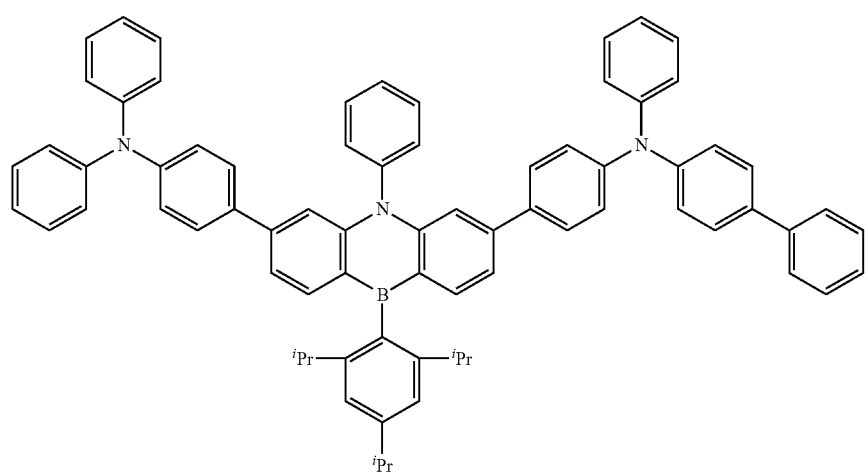
33
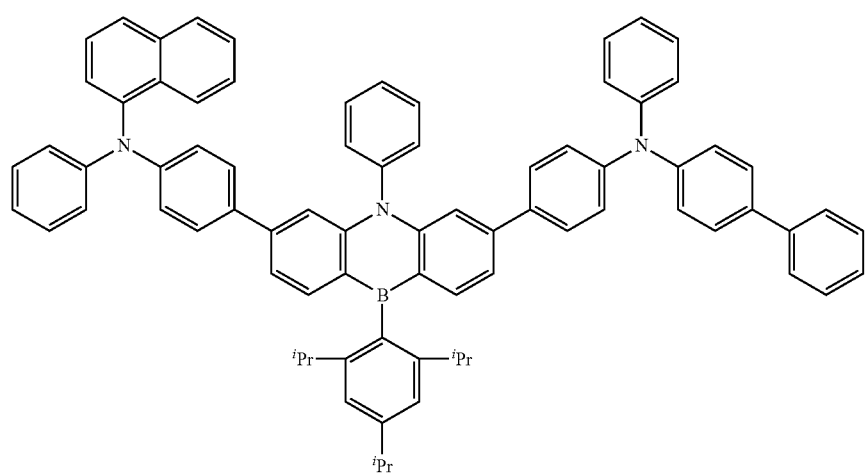
34

35
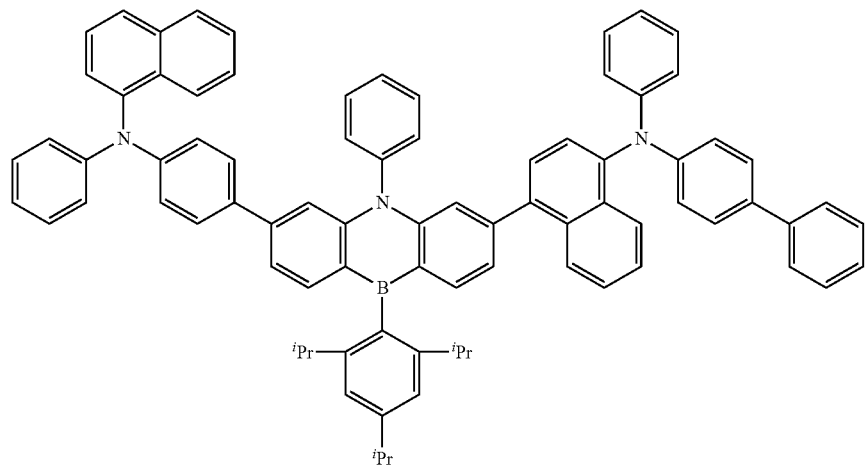
36
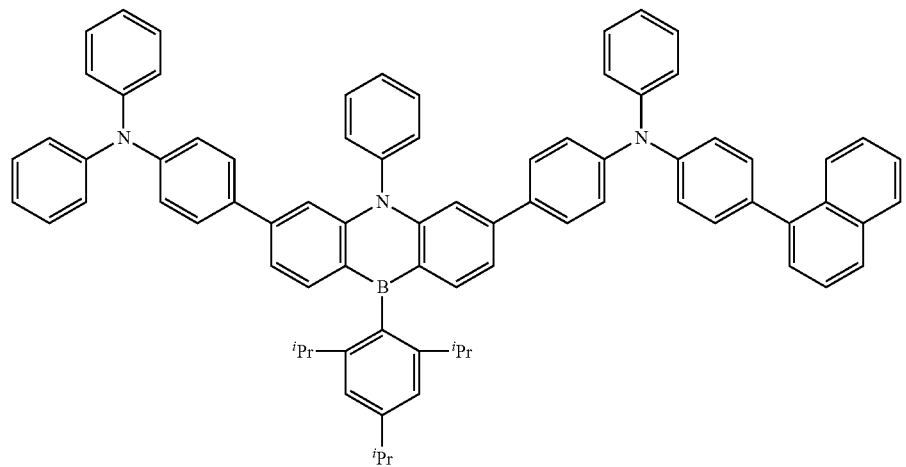
37
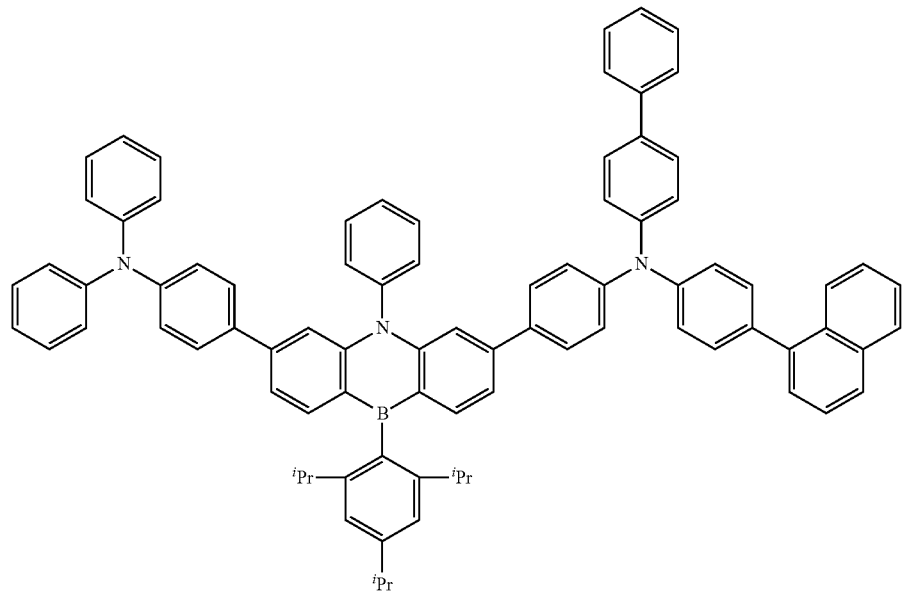

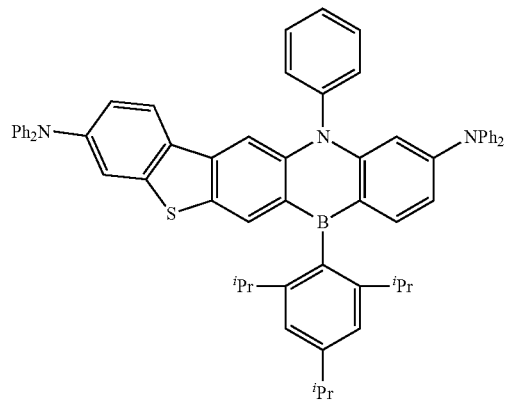

38

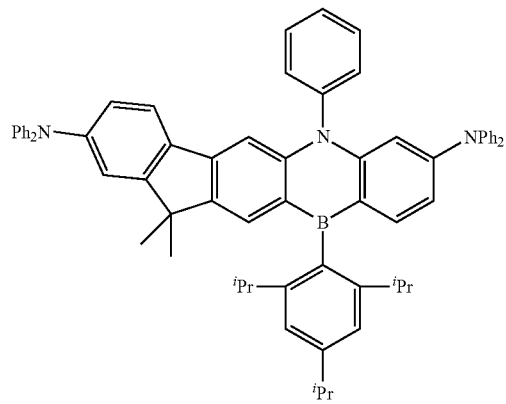

40

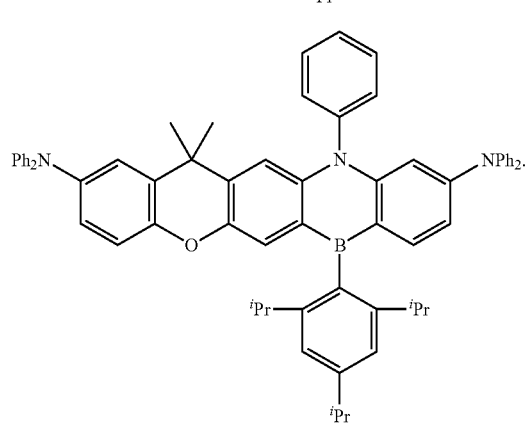

42

39

41

Embodiments of the polycyclic compound represented by Formula 1 of the present disclosure may be used in the organic electroluminescence device 10 of an embodiment to improve the efficiency and life-time of the organic electroluminescence device. For example, the described polycyclic compound represented by Formula 1 may be used in the emission layer EML of the organic electroluminescence device 10 of an embodiment to improve the luminous efficiency and life-time of the organic electroluminescence device.

In an embodiment, the emission layer EML may include a host and a dopant, and the host may be configured for delayed fluorescence emission and the dopant may be configured for delayed fluorescence emission. In some embodiments, the polycyclic compound of an embodiment represented by Formula 1 may be contained as a dopant material in the emission layer EML. For example, the polycyclic compound of an embodiment represented by Formula 1 may be used as a TADF dopant.

In some embodiments, the emission layer EML of an embodiment may include any suitable host material such as, for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl)anthracene (MADN), bis[2-(diphenylphosphino)phenyl] ether oxide (DPEPO), hexaphenylcyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), or the like. However, the present disclosure is not limited thereto, and in addition to the described host materials, any suitable delayed fluorescence emission host material available in the art may be included.

In some embodiments, the emission layer EML in the organic electroluminescence device 10 of an embodiment may further include any suitable dopant material available in the art. In an embodiment, the emission layer EML may use as a dopant, for example, a styryl derivative (such as 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and a derivative thereof (such as 2,5,8,11-tetra-t-butylperylene (TBPe)), pyrene and a derivative thereof (such as 1,1-dipyrene, 1,4-dipyrenylbenzene, 1,4-bis(N,N-diphenylamino)pyrene, and 1,6-bis(N,N-diphenylamino)pyrene), 1,3,5-tris(N-phenylbenzimidazol-2-yl)benzene (TPBi), or the like.

Referring to FIGS. 1 to 3 again, in the organic electroluminescence device 10 of an embodiment, the electron transport region ETR may be on the emission layer EML. The electron transport region ETR may include at least one of a hole blocking layer, an electron transport layer ETL, or an electron injection layer EIL, but the present disclosure is not limited thereto.

The electron transport region ETR may have a structure of: a single layer formed of a single material; a single layer formed of a plurality of different materials; or a multi-layer having a plurality of layers formed of a plurality of different materials.

For example, the electron transport region ETR may have a structure of a single layer which is an electron injection layer EIL or an electron transport layer ETL, or may have a structure of a single layer formed of an electron injection material and an electron transport material. In some embodiments, the electron transport region ETR may have a structure of a single layer formed of a plurality of different materials, or may have a structure of, sequentially laminated from the first electrode EL1, electron transport layer ETL/electron injection layer EIL or hole blocking layer/electron transport layer ETL/electron injection layer EIL, but the present disclosure is not limited thereto. A thickness of the electron transport region ETR may be, for example, about 100-1500 Å.

The electron transport region ETR may be formed using various suitable methods such as, for example, a vacuum deposition method, a spin coating method, a casting method, a Langmuir-Blodgett (LB) method, an inkjet printing method, a laser printing method, or a laser induced thermal imaging (LITI) method.

When the electron transport region ETR includes the electron transport layer ETL, the electron transport region ETR may include, for example, tris(8-hydroxyquinolinato) aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq$_2$), 9,10-di(naphthalene-2-yl)anthracene (ADN), or a mixture thereof, but the present disclosure is not limited thereto.

When the electron transport region ETR includes the electron transport layer ETL, a thickness of the electron transport layer ETL may be about 100-1000 Å, for example, about 150-500 Å. When the thickness of the electron transport layer ETL satisfies the described range, suitable or satisfactory electron transport performance may be achieved without substantial rise of a driving voltage.

When the electron transport region ETR includes the electron injection layer EIL, the electron transport region ETR may use, for example, a halogenated metal such as LiF, NaCl, CsF, RbCl, RbI, and KI, a lanthanide metal such as Yb, metal oxide such as Li$_2$O, BaO, or lithium quinolate (LiQ), but the present disclosure is not limited thereto. The electron injection layer EIL may also be formed of a mixture of an electron transport material and an insulative organometal salt. The organo-metal salt may be a material having an energy band gap of about 4 eV or more. For example, the organo-metal salt may include, for example, metal acetate, metal benzoate, metal acetoacetate, metal acetylacetonate, or metal stearate.

When the electron transport region ETR includes the electron injection layer EIL, thicknesses of the electron injection layers EIL may be about 1-100 Å or about 3-90 Å. When the thicknesses of the electron injection layers EIL satisfy the described range, suitable or satisfactory electron injection performance may be achieved without substantial rise of a driving voltage.

The electron transport region ETR may include the hole blocking layer as described above. The hole blocking layer may include, for example, at least one of 2,9-dimethyl-4,7-diphenyl-1,10-phenanthroline (BCP) or 4,7-diphenyl-1,10-phenanthroline (Bphen), but the present disclosure is not limited thereto.

The second electrode EL2 may be on the electron transport region ETR. The second electrode EL2 may have conductivity (e.g., electrical conductivity). The second electrode EL2 may be formed of a metal alloy or a conductive compound. The second electrode EL2 may be a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the second electrode EL2 may be a structure which has a plurality of layers including: a reflective layer or a transflective layer formed of the described materials; and a transparent conductive layer formed of ITO, IZO, ZnO, ITZO, or the like.

In some embodiments, the second electrode EL2 may be coupled to an auxiliary electrode. When the second electrode EL2 is coupled to the auxiliary electrode, resistance of the second electrode EL2 may be reduced.

In the organic electroluminescence device 10, as a voltage is applied to the first electrode EL1 and the second electrode EL2 respectively, the holes injected from the first electrode EL1 may move through the hole transport region HTR to the emission layer EML and the electrons injected from the second electrode EL2 may move through the electron transport region ETR to the emission layer EML. The electrons and the holes may be recombined in the emission layer EML to generate excitons, and the excitons may emit light when the excitons fall back (e.g., transition or relax) from an excited state to a ground state.

When the organic electroluminescence device 10 is a top emission type (e.g., a top emission kind of device), the first electrode EL1 may be a reflective electrode and the second electrode EL2 may be a transmissive electrode or a transflective electrode. When the organic electroluminescence device 10 is a bottom emission type (e.g., a bottom emission kind of device), the first electrode EL1 may be a transmissive electrode or a transflective electrode and the second electrode EL2 may be a reflective electrode.

The organic electroluminescence device 10 according to an embodiment of the present disclosure may exhibit the improved luminous efficiency and life-time characteristics using the described polycyclic compound as an emission layer material.

An embodiment of the present disclosure provides a polycyclic compound represented by Formula 1 below:

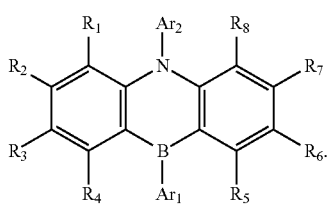

Formula 1

In Formula 1, $Ar_1$ and $Ar_2$ may each independently be a substituted or unsubstituted aryl ring having 6 to 30 carbon atoms for forming a ring, or a substituted or unsubstituted heteroaryl ring having 2 to 30 carbon atoms for forming a ring.

In Formula 1, $R_1$ to $R_8$ may each independently be a hydrogen atom, a deuterium atom, a halogen atom, a substituted or unsubstituted amino group, a cyano group, a boron group, a carbonyl group, a silyl group, an oxy group, a phosphine oxide group, a phosphine sulfide group, a substituted or unsubstituted thiol group, a sulfonyl group, a substituted or unsubstituted alkyl group having 1 to 20 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, or $R_1$ to $R_8$ may be combined with each other to form a ring.

As used herein, the expression "$R_1$ to $R_8$ may be combined with each other to form a ring" means that any adjacent pair of $R_1$ and $R_2$, $R_2$ and $R_3$, $R_3$ and $R_4$, $R_5$ and $R_6$, $R_6$ and $R_7$, or $R_7$ and $R_8$ may be combined with each other to form a ring, and $R_1$ to $R_8$ may not form a ring by bonding with $Ar_1$ and $Ar_2$.

In Formula 1, at least two selected from $R_1$ to $R_8$ may be represented by Formula 2 below:

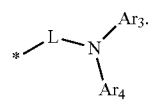

Formula 2

In Formula 2, L may be a direct bond, a substituted or unsubstituted arylene group having 6 to 30 carbon atoms for forming a ring, or a substituted or unsubstituted heteroarylene group having 2 to 30 carbon atoms for forming a ring, or may be combined with an adjacent group to form a ring. For example, L may be combined with any adjacent one selected from $R_1$ to $R_8$ to form a ring.

In Formula 2, $Ar_3$ and $Ar_4$ may each independently be a substituted or unsubstituted aryl group having 6 to 30 carbon atoms for forming a ring, or a substituted or unsubstituted heteroaryl group having 2 to 30 carbon atoms for forming a ring, or may be combined with adjacent groups to form a ring.

The description of the polycyclic compound with respect to the organic electroluminescence device of an embodiment may be equally applied to the polycyclic compound of an embodiment represented by Formula 1.

The polycyclic compound according to an embodiment may be any one selected from the compounds represented by Compound Group 1 as described herein above.

Hereinafter, embodiments of the present disclosure will be explained in more detail with reference to Examples and Comparative Examples. In addition, the following embodiments are only examples to assist understanding of the subject matter of the present disclosure, and the scope of the present disclosure is not limited thereto.

Synthesis Example

1. Synthesis of Polycyclic Compound

A synthesis method for the polycyclic compound described below is an example, and the synthesis method for the polycyclic compound according to the embodiment of the present disclosure is not limited to Examples below.

Synthesis of Compound 2

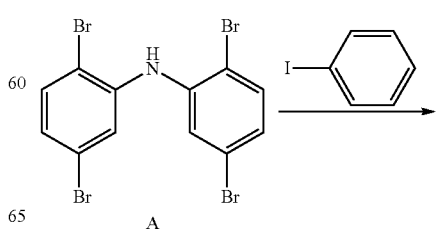

A

3) Synthesis of Compound 2

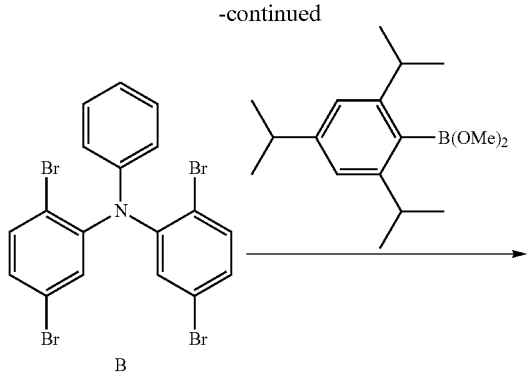

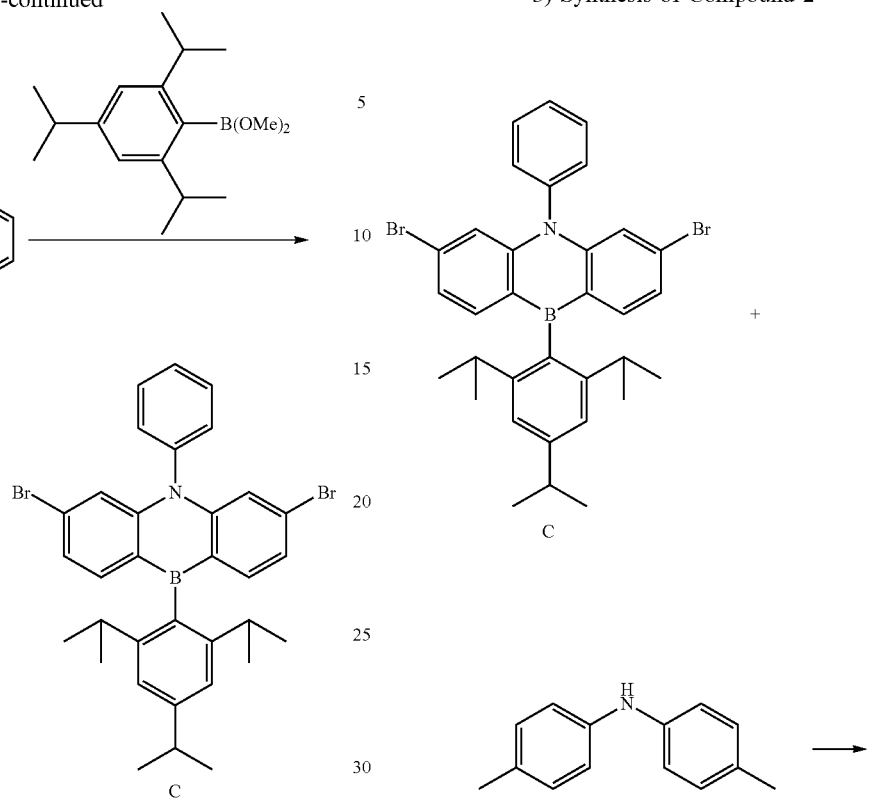

1) Synthesis of Intermediate B

Iodobenzene (32 g, 157 mmol) was added to Compound A (15 g, 31 mmol) in a 200 mL three-neck flask under Ar atmosphere, and CuI (6.0 g, 31 mmol) and potassium carbonate (8.6 g, 62 mmol) were also added thereto, and then, the mixture was stirred at 190° C. for 80 hours. After the reaction, the mixture was filtered by adding toluene, and then, the obtained organic phase was concentrated to obtain a viscous material. The obtained crude product was purified by column chromatography (silica gel) to obtain 10.3 g (18 mmol, yield of 58%) of Intermediate B. The mass number of Intermediate B measured by FAB-MS was 557.

2) Synthesis of Intermediate C

Dehydrated diethylether 150 mL was added to Intermediate B (6.2 g, 12.8 mmol) in a 500 mL three-neck flask under Ar atmosphere, and Intermediate B was dissolved therein, and then, the mixture was stirred at −78° C. for 1 hour. 1.6 M of an n-BuLi hexane solution 16 mL (25 mmol) was added dropwise thereto, and then, the mixture was stirred for 2 hours. 2,4,6-triisopropylphenylboronic acid methyl ester 4.0 g (14 mmol) was added thereto, and the temperature of the reaction solution was raised to room temperature while stirring, and then, the reaction solution was stirred overnight at room temperature. After the reaction, water was added to the solution to finish the reaction, and the product was extracted with chloroform. The obtained organic phase was concentrated to obtain a crude product as a solid. The obtained crude product was purified by column chromatography (silica gel) to obtain 2.8 g (4.6 mmol, yield of 36%) of Intermediate C. The mass number of Intermediate C measured by FAB-MS was 613.

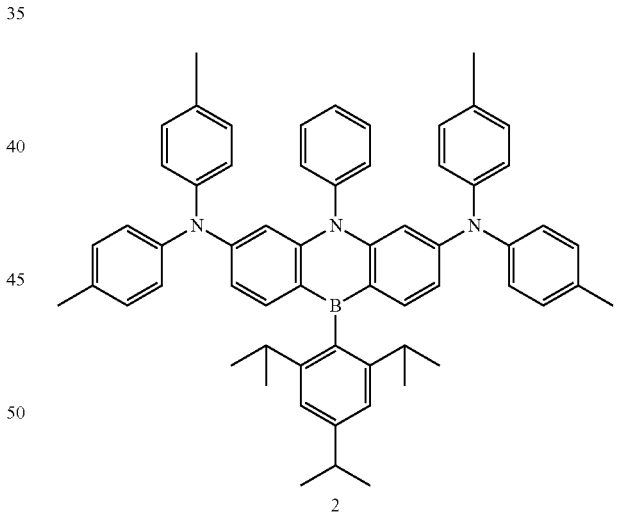

Intermediate C (1.1 g, 1.8 mmol), 4,4'-ditolylamine (0788 g, 4.0 mmol), Pd₂(dba)₃ (0.183 g, 0.20 mmol), (t-Bu)₃P (0.162 g, 0.80 mmol), and sodium t-butoxide (0.769 g, 8.0 mmol) were added to a 100 mL three-neck flask under Ar atmosphere, and the mixture was stirred in a toluene solvent 20 mL at 80° C. for 12 hours. After air cooling, water was added to separate an organic layer, and the solvent was distilled off. The obtained crude product was purified by silica gel column chromatography to obtain 1.1 g (1.3 mmol, yield of 72%) of Compound 2 as a white solid. The mass number of Compound 2 measured by FAB-MS was 848.

Synthesis of Compound 10

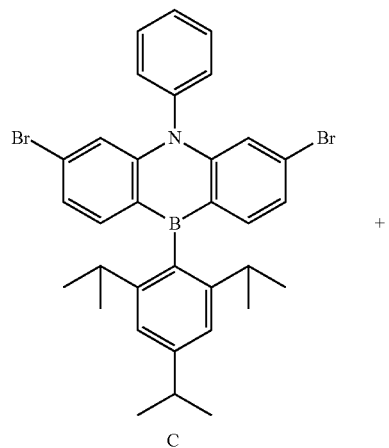

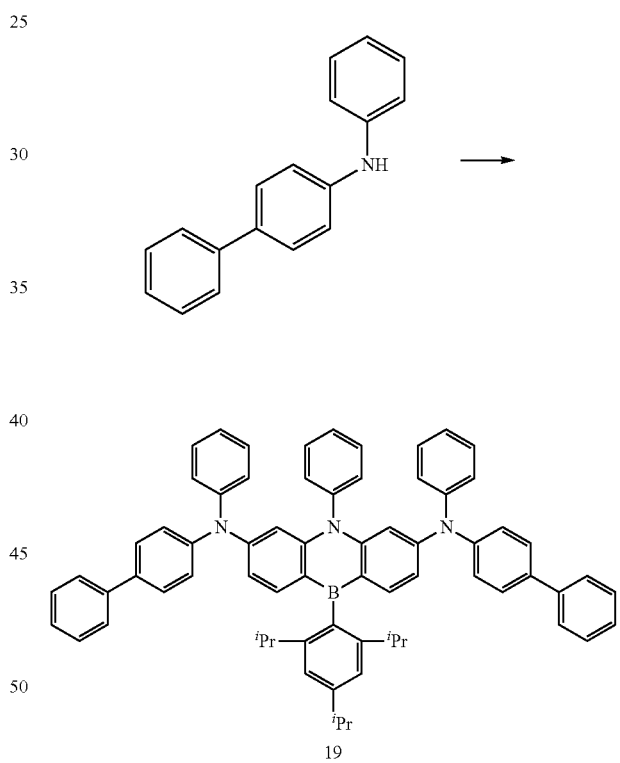

Intermediate C (1.1 g, 1.8 mmol), N-phenyl-3-dibenzofuranamine (0.466 g, 4.0 mmol), Pd$_2$(dba)$_3$ (0.183 g, 0.20 mmol), (t-Bu)$_3$P (0.162 g, 0.80 mmol), and sodium t-butoxide (0.769 g, 8.0 mmol) were added to a 100 mL three-neck flask under Ar atmosphere, and the mixture was stirred in a toluene solvent 20 mL at 80° C. for 12 hours. After air cooling, water was added to separate an organic layer, and the solvent was distilled off. The obtained crude product was purified by silica gel column chromatography to obtain 1.5 g (1.5 mmol, yield of 83%) of Compound 10 as a white solid. The mass number of Compound 10 measured by FAB-MS was 971.

Synthesis of Compound 19

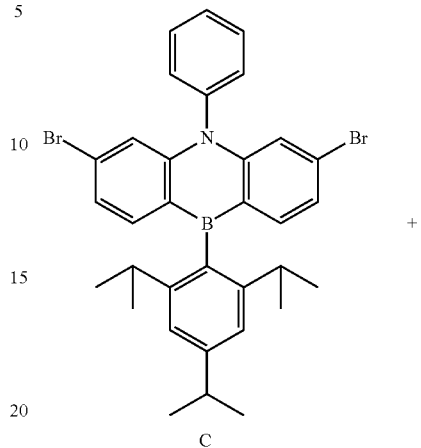

Intermediate C (1.1 g, 1.8 mmol), N-phenyl-3-N-phenyl-4-biphenylamine (0.980 g, 4.0 mmol), Pd$_2$(dba)$_3$ (0.183 g, 0.20 mmol), (t-Bu)$_3$P (0.162 g, 0.80 mmol), and sodium t-butoxide (0.769 g, 8.0 mmol) were added to a 100 mL three-neck flask under Ar atmosphere, and the mixture was stirred in a toluene solvent 20 mL at 80° C. for 12 hours. After air cooling, water was added to separate an organic layer, and the solvent was distilled off. The obtained crude product was purified by silica gel column chromatography to obtain 1.2 g (1.3 mmol, yield of 72%) of Compound 19 as a white solid. The mass number of Compound 19 measured by FAB-MS was 944.

Synthesis of Compound 38

1) Synthesis of Intermediate D

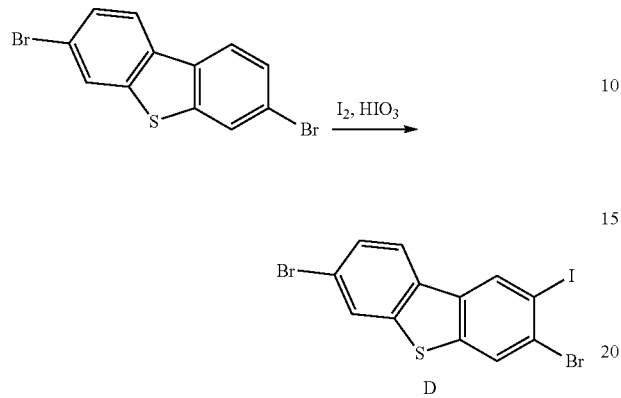

2,6-dibromodibenzothiophene 27.3 g (80.0 mmol), oxo 2.06 g (40.1 mmol), oxoacid 3.13 g (17.8 mmol), acetic acid 80 mL, sulfuric acid 5 mL, water 5 mL, and CHCl₃ 2 mL were stirred in a 200 mL round-bottom flask at 65° C. for 3 hours. After cooling, water was added to the mixture, and then, the precipitated solid was subjected to suction-filtration and washed three times with water. The residue was recrystallized from toluene to obtain 27.0 g (57.7 mmol, yield of 72%) of Intermediate D. The mass number of Intermediate D measured by FAB-MS was 468.

2) Synthesis of Intermediate E

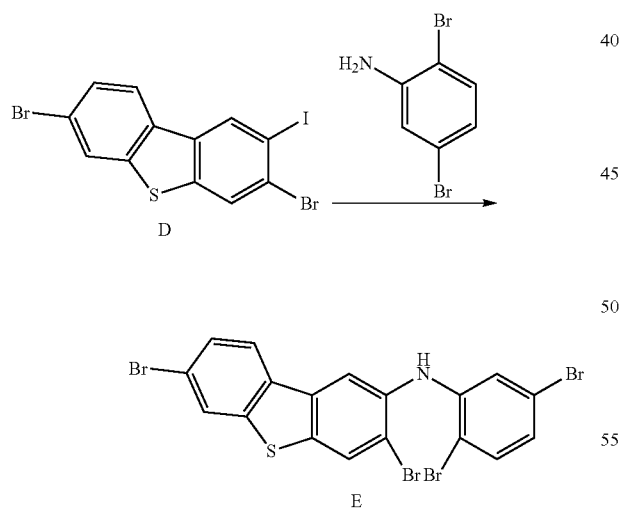

Intermediate D 27.0 g, (57.7 mmol), 2,5-dibromoaniline 14.5 g (57.7 mmol), Pd(OAc)₂ 0.65 g (2.9 mmol), Xantphos 1.67 g (2.9 mmol), and NaOtBu 5.82 g (60.6 mmol) were added to a 500 mL three-neck flask under Ar atmosphere, and the mixture was stirred in a dioxane solvent 120 mL at 100° C. for 8 hours. After air cooling, water was added to separate an organic layer, and the solvent was distilled off. The obtained crude product was purified by column chromatography (silica gel) to obtain 23.5 g (yield of 69%) of Intermediate E. The mass number of Intermediate E measured by FAB-MS was 591.

3) Synthesis of Intermediate F

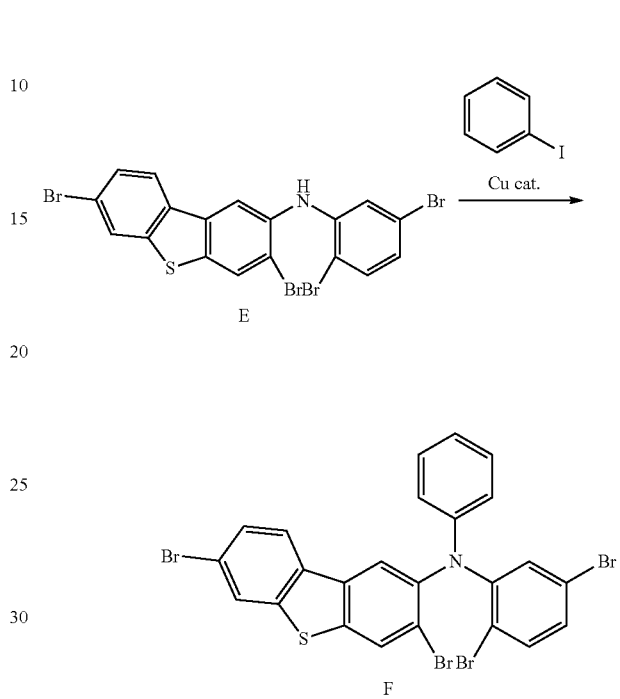

Iodobenzene (40.8 g, 200 mmol) was added to Intermediate E (23.5 g, 40 mmol) in a 200 mL three-neck flask under Ar atmosphere, and CuI (7.6 g, 40 mmol) and potassium carbonate (11.1 g, 80 mmol) were also added thereto, and then, the mixture was stirred at 190° C. for 80 hours. After the reaction, the mixture was filtered by adding toluene, and then, the obtained organic phase was concentrated to obtain a viscous material. The obtained crude product was purified by column chromatography (silica gel) to obtain 15.1 g (22.8 mmol, yield of 57%) of Intermediate F. The mass number of Intermediate F measured by FAB-MS was 667.

4) Synthesis of Intermediate G

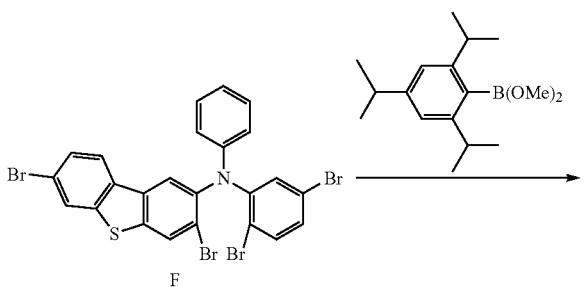

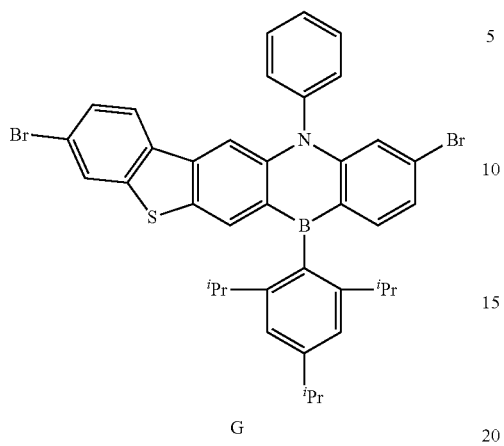

G

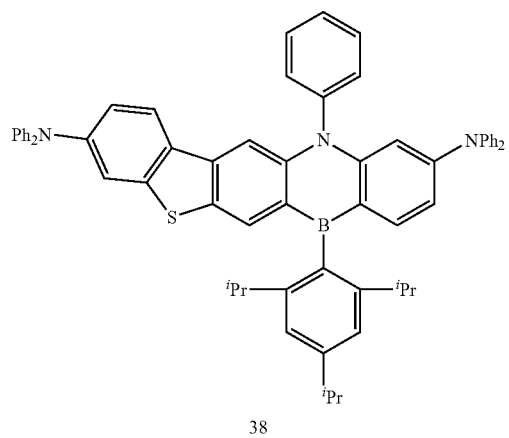

38

Dehydrated diethylether 230 mL was added to Intermediate F (15.1 g, 22.8 mmol) in a 500 mL three-neck flask under Ar atmosphere, and Intermediate F was dissolved therein, and then, the mixture was stirred at −78° C. for 1 hour. 1.6 M of an n-BuLi hexane solution 29 mL (46 mmol) was added dropwise thereto, and then, the mixture was stirred for 2 hours. 2,4,6-triisopropylphenylboronic acid methyl ester 6.4 g (23 mmol) was added thereto, and the temperature of the reaction solution was raised to room temperature while stirring, and then, the reaction solution was stirred overnight at room temperature. After the reaction, water was added to the solution to finish the reaction, and the product was extracted with chloroform. The obtained organic phase was concentrated to obtain a crude product as a solid. The obtained crude product was purified by column chromatography (silica gel) to obtain 4.76 g (6.6 mmol, yield of 29%) of Intermediate G. The mass number of Intermediate G measured by FAB-MS was 721.

5) Synthesis of Compound 38

Intermediate G (4.76 g, 6.6 mmol), diphenylamine (2.46 g, 14.5 mmol), $Pd_2(dba)_3$ (0.12 g, 0.13 mmol), (t-Bu)$_3$P (0.21 g, 1.06 mmol), and sodium t-butoxide (1.39 g, 14.5 mmol) were added to a 100 mL three-neck flask under Ar atmosphere, and the mixture was stirred in a toluene solvent 30 mL at 100° C. for 12 hours. After air cooling, water was added to separate an organic layer, and the solvent was distilled off. The obtained crude product was purified by silica gel column chromatography to obtain 3.68 g (4.1 mmol, yield of 63%) of Compound 38 as a yellow solid. The mass number of Compound 38 measured by FAB-MS was 898.

2. Production and Evaluation of Organic Electroluminescence Device Including Polycyclic Compound Compounds of Example

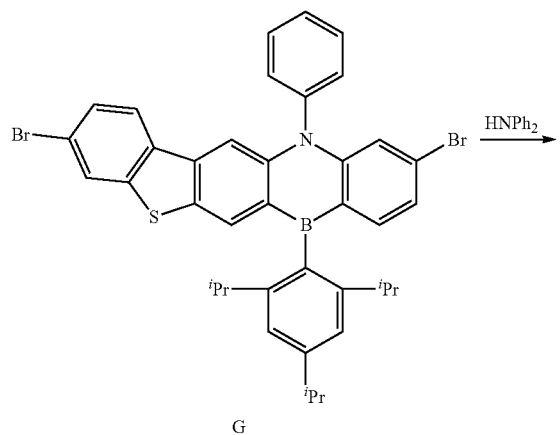

G

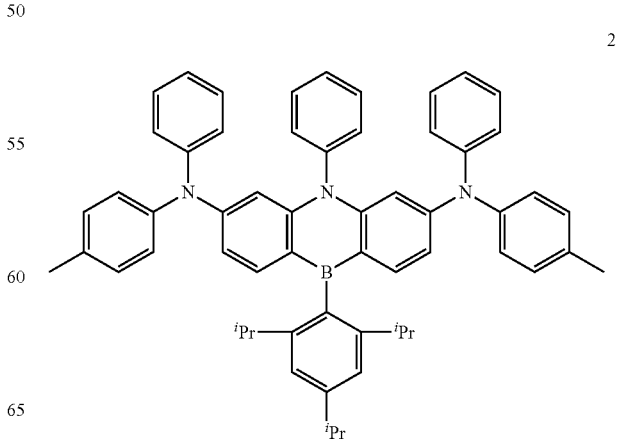

2

-continued

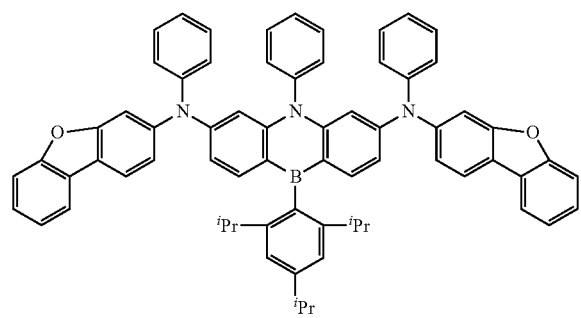
10

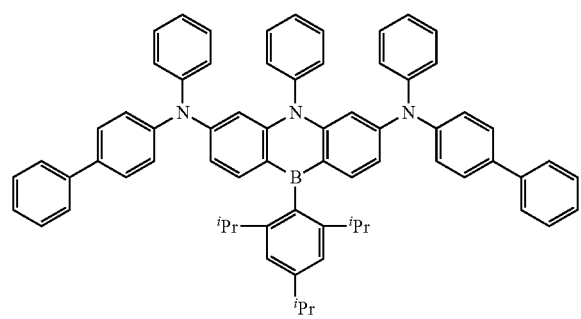
19

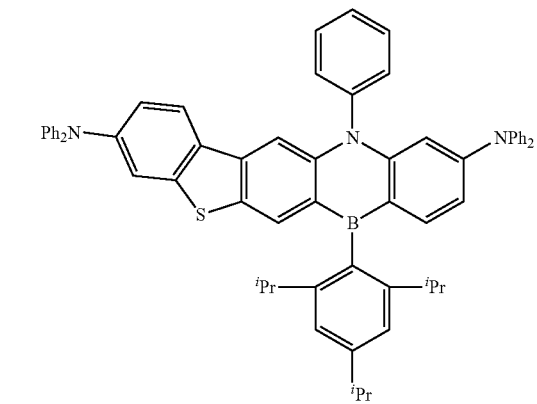
38

Compounds of Comparative Example

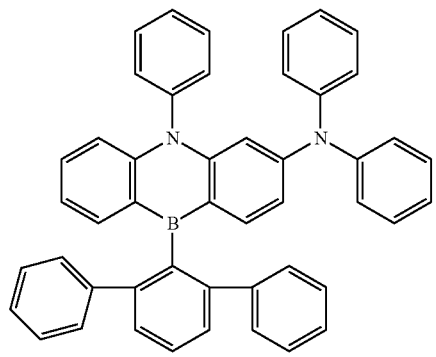
C-1

-continued

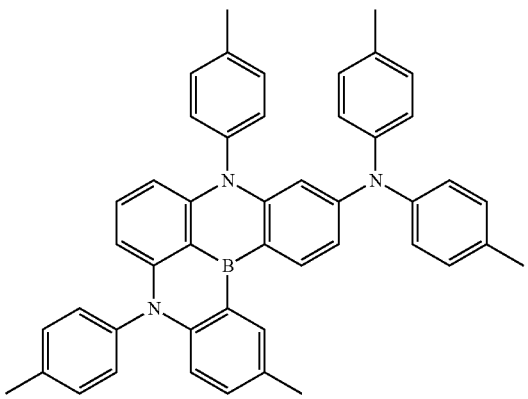
C-2

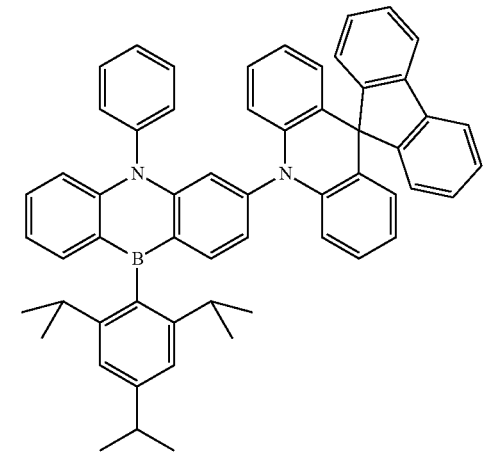
C-3

The organic electroluminescence devices in the Examples and Comparative Examples were produced according to the method described herein below.

ITO having a thickness of 1500 Å was patterned on a glass substrate, washed with ultrapure water, and treated with UV ozone for 10 minutes. Thereafter, HAT-CN was deposited to have a thickness of 100 Å, α-NPD was deposited to have a thickness of 800 Å, and mCP was deposited to have a thickness of 50 Å to form a hole transport region.

Next, when the emission layer was formed, the polycyclic compound of the Example or the compound of the Comparative Example, and DPEPO were co-deposited to a weight ratio of 20:80 to form a layer having a thickness of 200 Å. Next, a layer having a thickness of 100 Å was formed by using DPEPO. That is, the emission layers, which were formed by the co-deposition, were deposited by mixing Compounds 2, 10, 19, and 38 with DPEPO in Examples 1 to 4, respectively (e.g., the emission layer of Example 1 included Compound 2 and DPEPO, the emission layer of Example 2 included Compound 10 and DPEPO, the emission layer of Example 3 included Compound 19 and DPEPO, and the emission layer of Example 4 included Compound 38 and DPEPO), and by mixing Compounds of Comparative Example C1, C2, and C3 with DPEPO in Comparative Examples 1 to 3, respectively (e.g., the emission layer of Comparative Example 1 included Compound C1 and DPEPO, the emission layer of Comparative Example 2 included Compound C2 and DPEPO, and the emission layer of Comparative Example 3 included Compound C3 and DPEPO).

On the emission layer, a layer having a thickness of 300 Å was formed of TPBi and a layer having a thickness of 5 Å was formed of LiF to form an electron transport region. Subsequently, a second electrode having a thickness of 1000 Å was formed of aluminum (Al).

The hole transport region, the emission layer, the electron transport region, and the second electrode were formed by using vacuum deposition apparatus in the Examples.

Performance Evaluation of Organic Electroluminescence Device

Full width at half maximum (nm), external quantum yield (%), and life-time were measured to evaluate the performances of the organic electroluminescence devices according to the Examples and Comparative Examples. In the measurement, a luminance orientation characteristic measuring apparatus of Hamamatsu Photonics C9920-11 was used as the measuring apparatus. The life-time represents the luminance half-time from the initial luminance of 100 cd/m$^2$, and the external quantum yield represents a value at 10 mA/cm$^2$.

TABLE 1

| Division | Dopant in emission layer | Full width at half maximum (nm) | External quantum yield (%) | Life-time (LT$_{50}$ (h)) |
|---|---|---|---|---|
| Example 1 | Compound 2 of Example | 26 | 16.0 | 21.8 |
| Example 2 | Compound 10 of Example | 27 | 18.1 | 24.7 |
| Example 3 | Compound 19 of Example | 31 | 16.1 | 33.4 |
| Example 4 | Compound 38 of Example | 28 | 15.4 | 21.4 |
| Comparative Example 1 | Compound C1 of Comparative Example | 38 | 6.4 | 4.4 |
| Comparative Example 2 | Compound C2 of Comparative Example | 35 | 16.5 | 3.1 |
| Comparative Example 3 | Compound C3 of Comparative Example | 82 | 13.0 | <0.1 |

Referring to Table 1, it can be seen that the organic electroluminescence devices in Examples 1 to 4, in which the polycyclic compounds of Example had been used as dopant materials in the emission layer, exhibited high efficiency, narrow full width at half maximum, and long life-time as compared with Comparative Examples 1 to 3.

While the present disclosure is not limited by any particular mechanism or theory, it is believed that because, in Examples 1 to 4, two amine groups are included in the azaborine portion to stabilize the molecule, the high efficiency, narrow full width at half maximum, and long life-time are achieved as compared with Comparative Examples.

It is also believed that because, in Compounds C1, C2, and C3 of Comparative Examples 1 to 3, respectively, one diphenylamino group is substituted in the azaborine core portion, the stability is deteriorated or reduced as compared with the compounds of the Examples.

Furthermore, it is believed that, in Compound C1 of Comparative Example 1, no substituent is included in the diphenylamino group portion, and therefore, the amino group is not further stabilized, and the phenyl group, which has phenyl groups as substituents, is combined with the boron atom, and therefore, the boron group is unstable and a structure change is not suppressed (or likelihood thereof reduced) as compared with the compounds of the Examples, which have isopropyl groups as substituents, such that the life-time and efficiency of the device are deteriorated or reduced.

Compound C2 of Comparative Example 2 was unstable as compared with the compounds of the Examples because a substituent, which serves as a sterically protective group around the boron atom, is not present, and therefore, the life-time of the device was particularly deteriorated. Furthermore, it is believed that the boron group in the azaborine group additionally forms a condensed ring to particularly destabilize the boron group, and as a result, the molecular stability is deteriorated (or reduced) to reduce the life-time of the device.

It is also believed that, in Compound 3 of Comparative Example 3, the acridine group is combined with the azaborine group to largely distort the bond between the azaborine group and the acridine group, and therefore, the molecular stability is deteriorated (or reduced) to reduce the life-time as compared with Examples.

The organic electroluminescence device of an embodiment having high luminous efficiency in a blue light wavelength region may be achieved by using the polycyclic compound represented by Formula 1 as an emission layer material.

An organic electroluminescence device according to an embodiment of the present disclosure may have high efficiency and long life-time.

A polycyclic compound according to an embodiment of the present disclosure may improve life-time and efficiency of an organic electroluminescence device including the polycyclic compound.

Although the exemplary embodiments of the present disclosure have been described, it is understood that the present disclosure should not be limited to these exemplary embodiments but various changes and modifications can be made by one ordinary skilled in the art within the spirit and scope of the appended claims, and equivalents thereof.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Therefore, the technical scope of the present disclosure should not be limited to the contents described in the detailed description of the specification, but should be defined by the appended claims, and equivalents thereof.

What is claimed is:

1. An organic electroluminescence device comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides of one or more selected from them,
wherein the emission layer comprises a polycyclic compound represented by Formula 1:

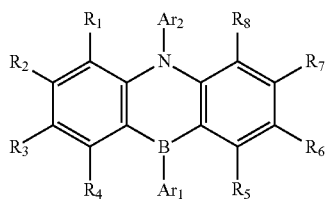

Formula 1 in Formula 1,
$Ar_1$ and $Ar_2$ are each independently a substituted or unsubstituted aryl ring having 6 to 30 carbon atoms for forming a ring, or a substituted or unsubstituted heteroaryl ring having 2 to 30 carbon atoms for forming a ring,
$R_1$ to $R_8$ are each independently a hydrogen atom, a deuterium atom, a halogen atom, a substituted or unsubstituted amino group, a cyano group, a boron group, a carbonyl group, a silyl group, an oxy group, a phosphine oxide group, a phosphine sulfide group, a substituted or unsubstituted thiol group, a sulfonyl group, a substituted or unsubstituted alkyl group having 1 to 20 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, or $R_1$ to $R_8$ are combined with each other to form a ring, and
at least two selected from $R_1$ to $R_8$ are represented by Formula 2:

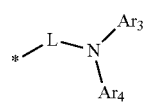

Formula 2 in Formula 2,
L is a direct bond, a substituted or unsubstituted arylene group having 6 to 30 carbon atoms for forming a ring, or a substituted or unsubstituted heteroarylene group having 2 to 30 carbon atoms for forming a ring, or is combined with an adjacent group to form a ring, and
$Ar_3$ and $Ar_4$ are each independently a substituted or unsubstituted aryl group having 6 to 30 carbon atoms for forming a ring, or a substituted or unsubstituted heteroaryl group having 2 to 30 carbon atoms for forming a ring, or are combined with adjacent groups to form a ring.

2. The organic electroluminescence device of claim 1, wherein the emission layer is configured to emit delayed fluorescence.

3. The organic electroluminescence device of claim 1,
wherein the emission layer is a delayed fluorescence emission layer comprising a host and a dopant, and
wherein the dopant is the polycyclic compound.

4. The organic electroluminescence device of claim 1, wherein the emission layer is a thermally activated delayed fluorescence emission layer configured to emit blue light.

5. The organic electroluminescence device of claim 1, wherein $Ar_1$ is represented by Formula 3:

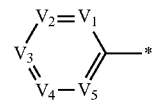

Formula 3 in Formula 3,
$V_1$ to $V_5$ are each independently N or $CR_9$,
wherein $R_9$ is a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 1 to 20 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, or is combined with an adjacent group to form a ring.

6. The organic electroluminescence device of claim 5,
wherein at least one selected from $V_1$ and $V_5$ in Formula 3 is $CR_{10}$, and
wherein $R_{10}$ is a substituted or unsubstituted alkyl group having 2 to 20 carbon atoms.

7. The organic electroluminescence device of claim 1, wherein $Ar_3$ in Formula 2 is a substituted aryl group having 6 to 30 carbon atoms for forming a ring, or a substituted or unsubstituted heteroaryl group having 2 to 30 carbon atoms for forming a ring.

8. The organic electroluminescence device of claim 1,
wherein at least one selected from $R_1$ to $R_4$ in Formula 1 is represented by Formula 2, and
at least one selected from $R_5$ to $R_8$ in Formula 1 is represented by Formula 2.

9. The organic electroluminescence device of claim 1, wherein Formula 1 is represented by Formula 4:

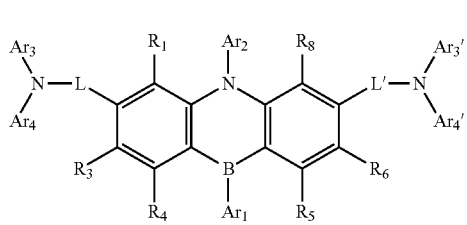

Formula 4 in Formula 4,
L' is a direct bond, a substituted or unsubstituted arylene group having 6 to 30 carbon atoms for forming a ring, or a substituted or unsubstituted heteroarylene group having 2 to 30 carbon atoms for forming a ring, $Ar_3'$ and $Ar_4'$ are each independently a substituted or unsubstituted aryl group having 6 to 30 carbon atoms for forming a ring, or a substituted or unsubstituted heteroaryl group having 2 to 30 carbon atoms for forming a ring, or are combined with adjacent groups to form a ring, and $Ar_1$ to $Ar_4$, $R_1$, $R_3$ to $R_6$, $R_8$, and L are the same as defined with respect to Formula 1 or Formula 2.

10. The organic electroluminescence device of claim 9, wherein at least one selected from L and L' is a substituted or unsubstituted arylene group having 6 to 30 carbon atoms for forming a ring, or a substituted or unsubstituted heteroarylene group having 2 to 30 carbon atoms for forming a ring.

11. The organic electroluminescence device of claim 9, wherein L and L' are each independently a direct bond.

12. The organic electroluminescence device of claim 1, wherein the polycyclic compound represented by Formula 1 is any one selected from compounds represented by Compound Group 1:

Compound Group 1

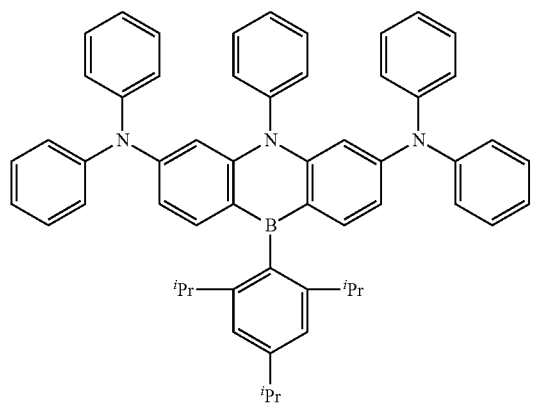

1

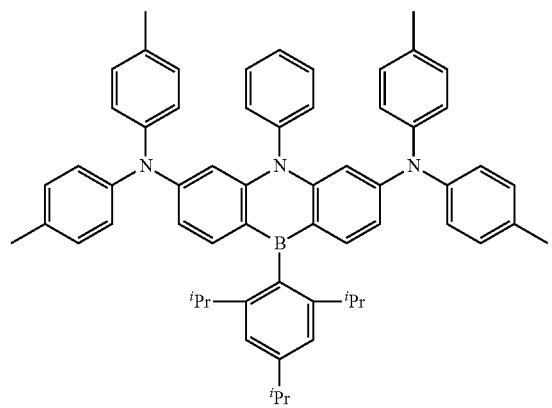

2

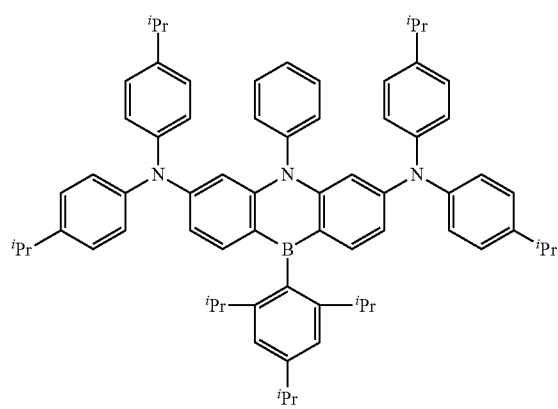

3

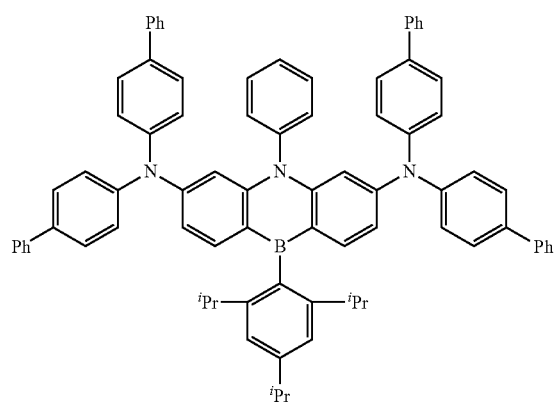

4

-continued
5
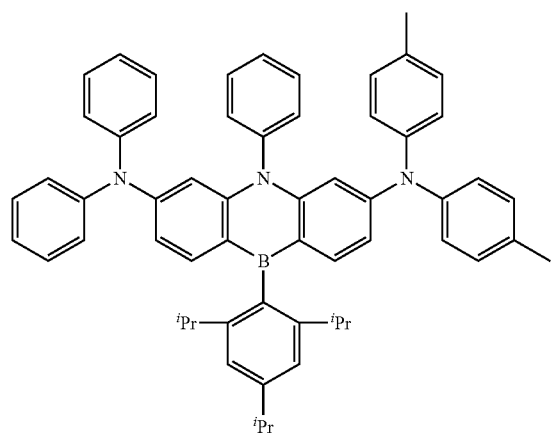
6
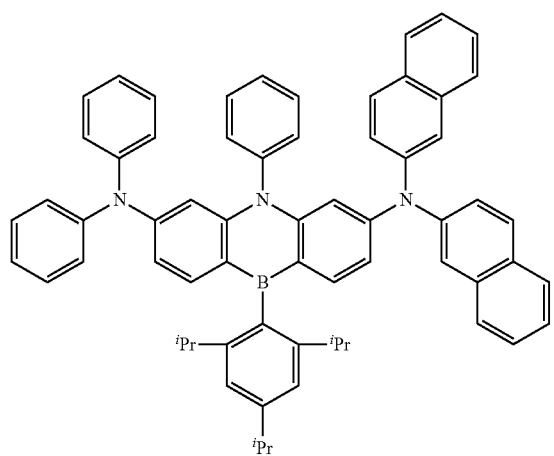
7
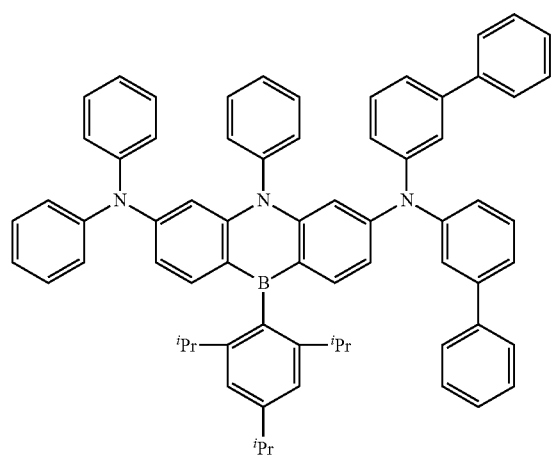
8
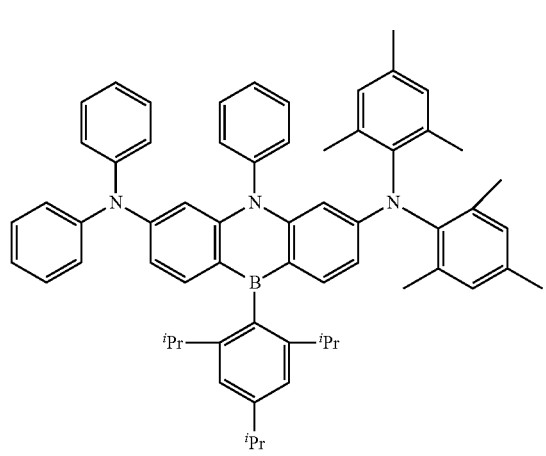
9
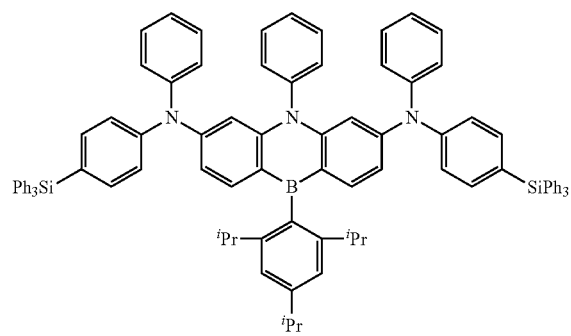
10
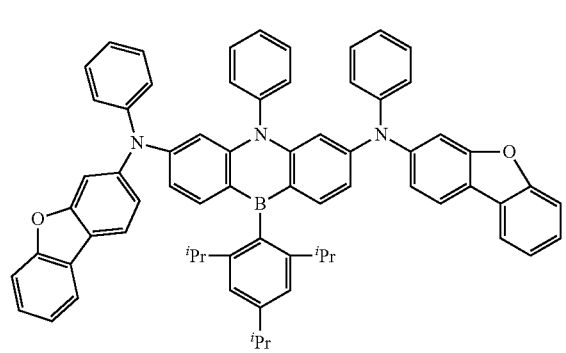
11
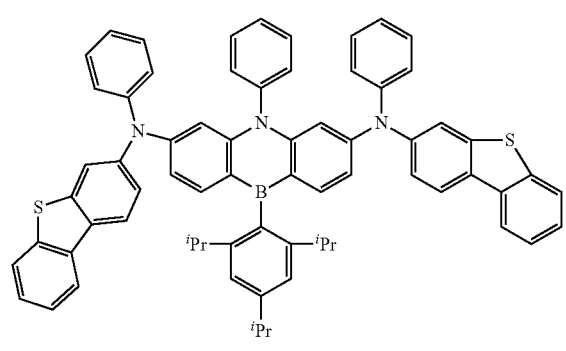
12
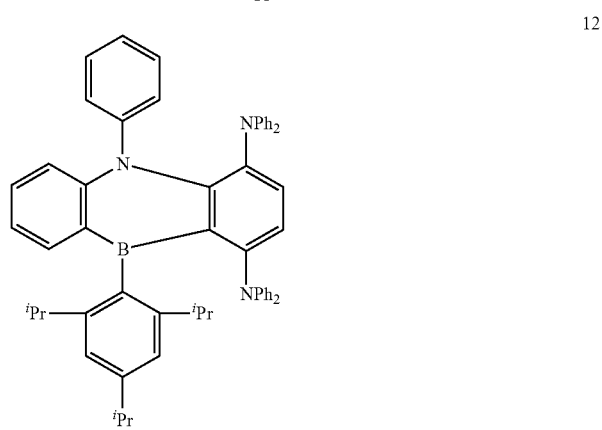

-continued
13
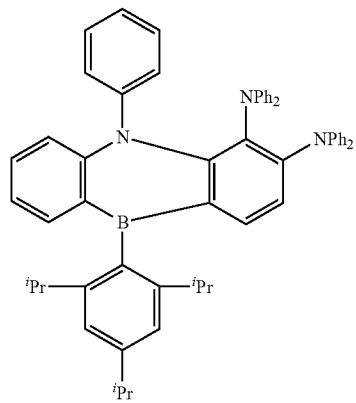
14
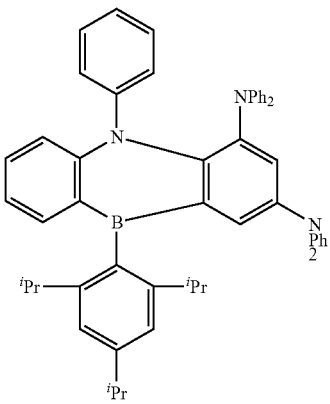
15
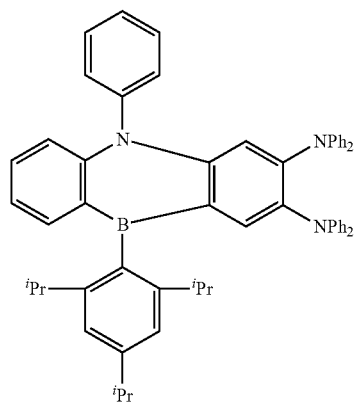
16
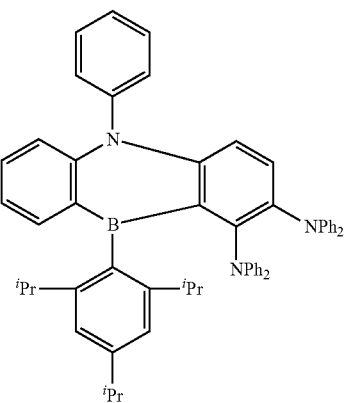
17
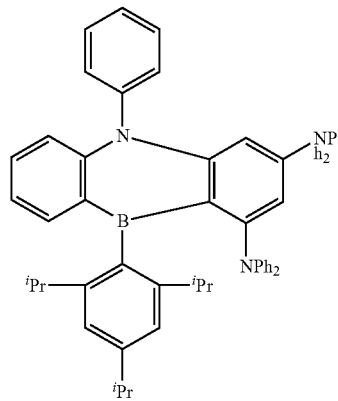
18
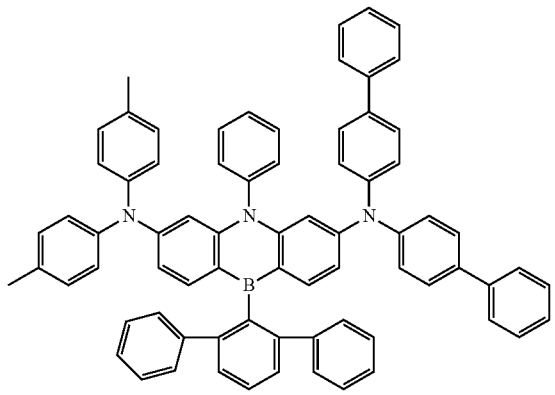
19
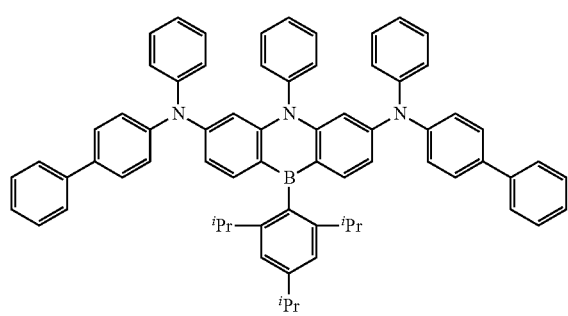
20
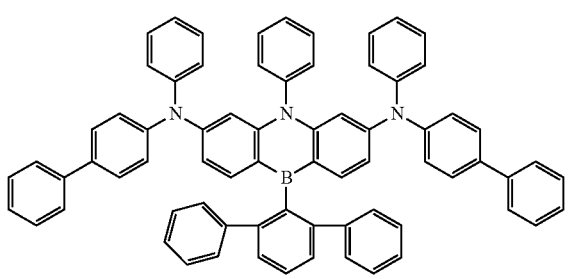

-continued
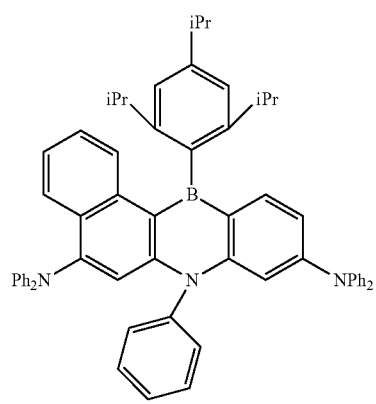
21
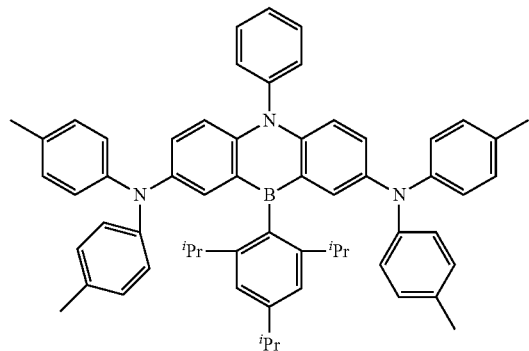
22
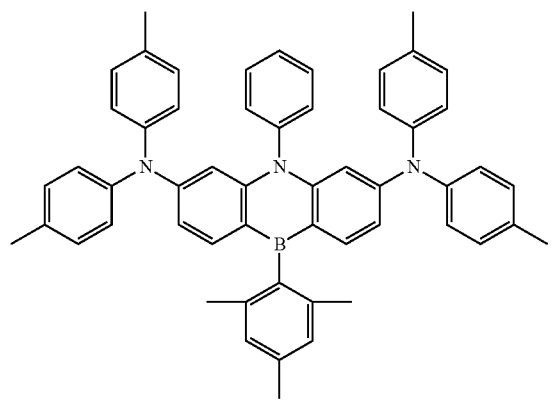
23
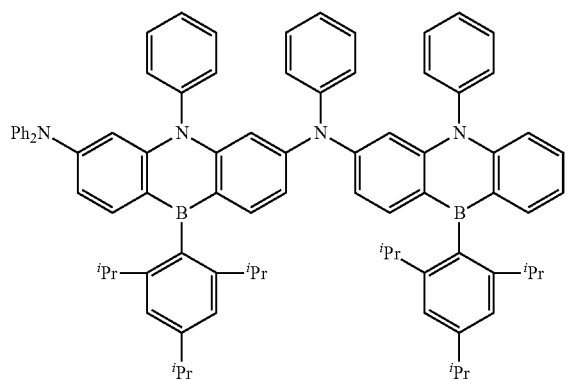
24
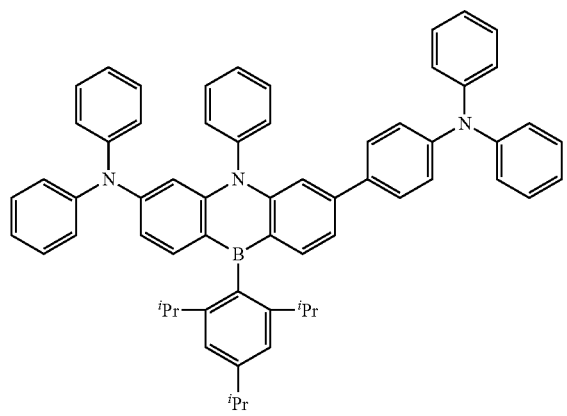
25
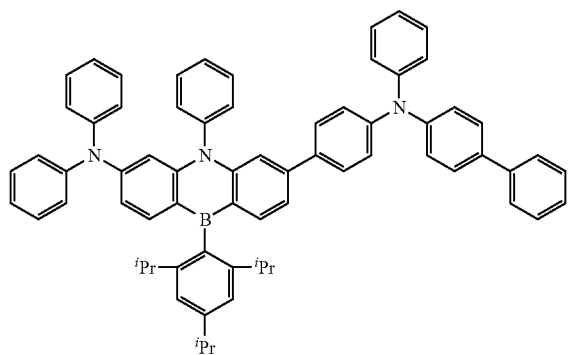
26
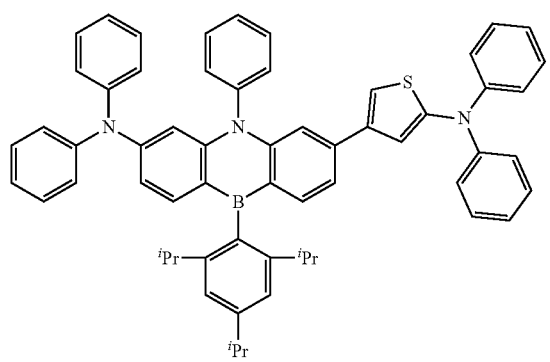
27
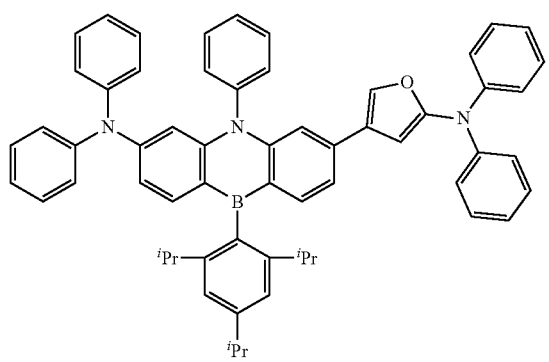
28

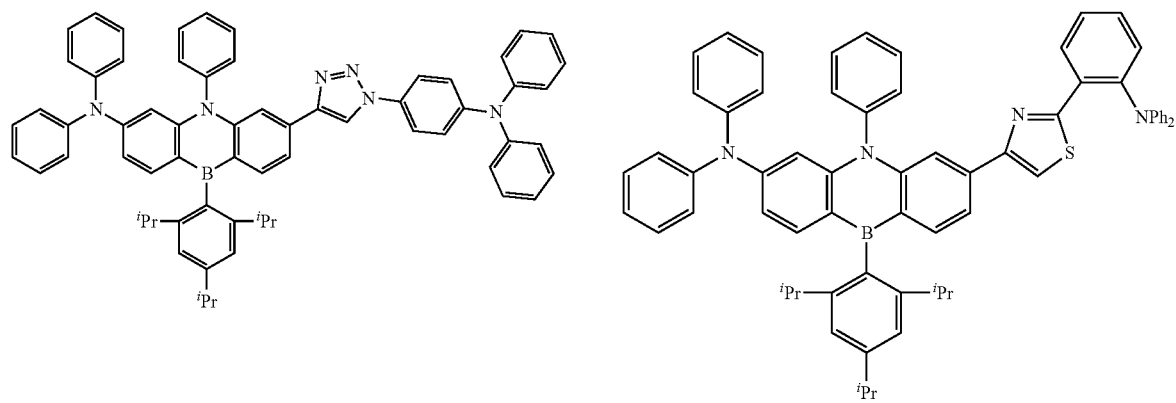
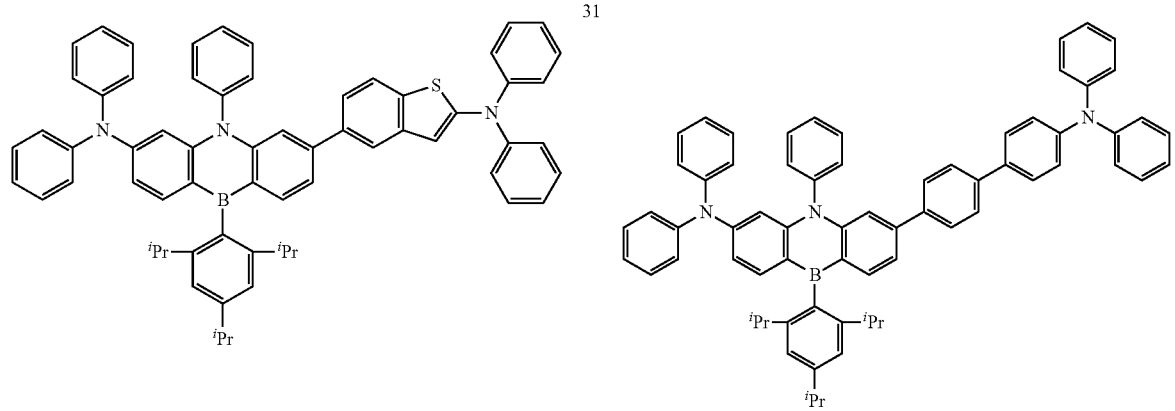
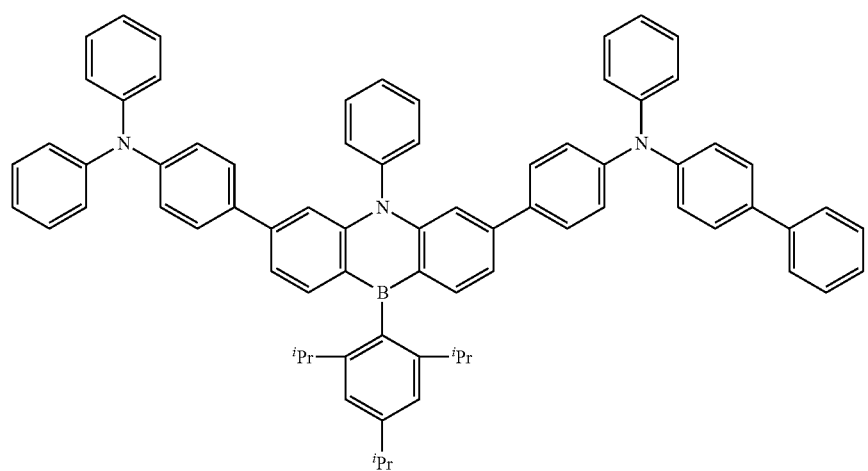

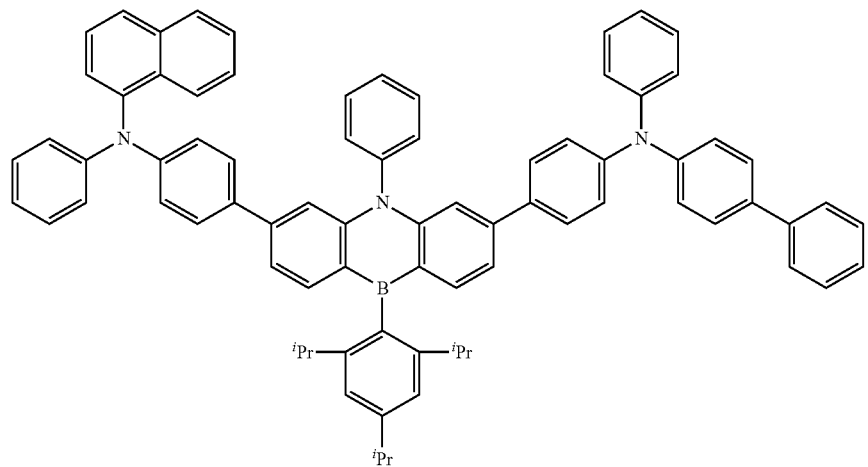
34
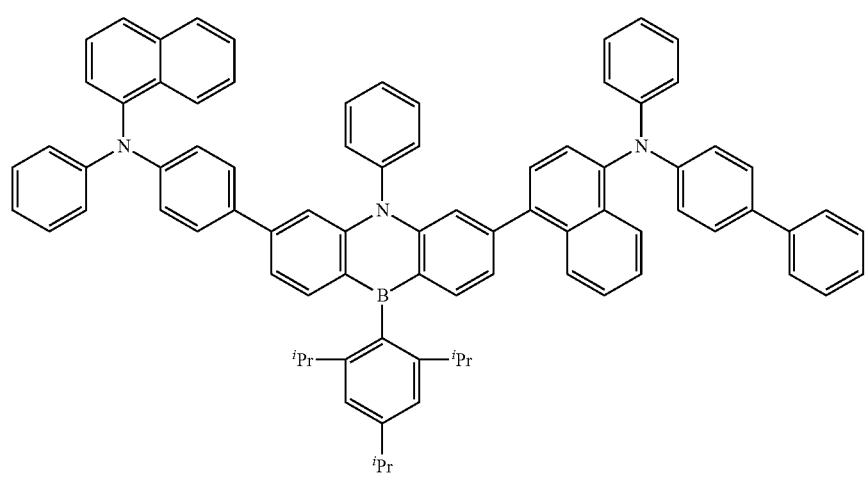
35
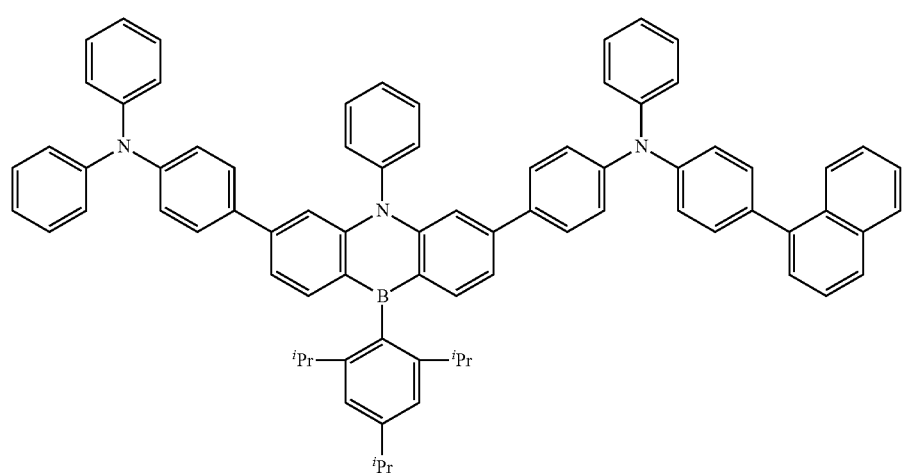
36

37
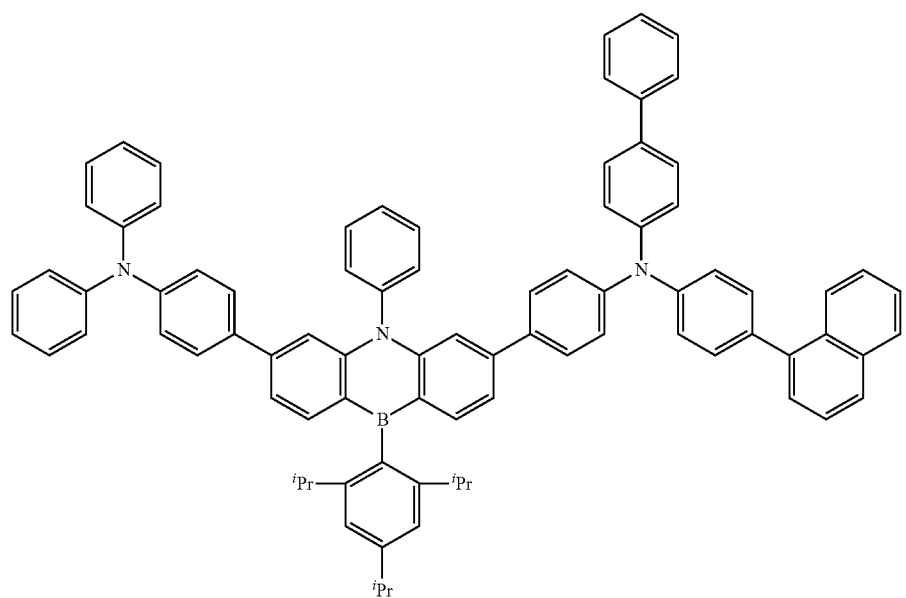
38
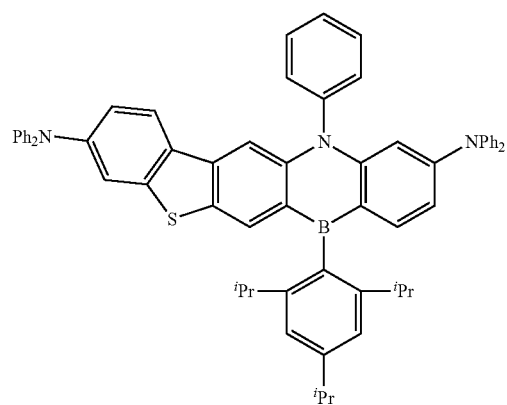
39
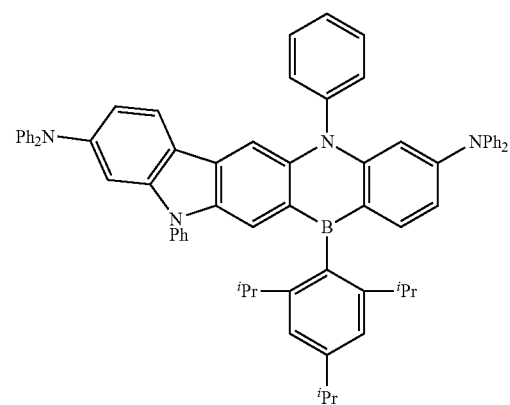
40
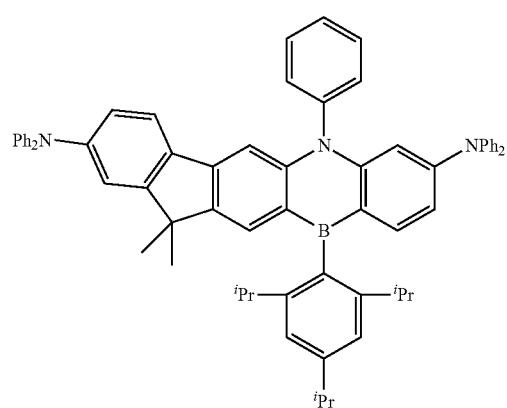
41
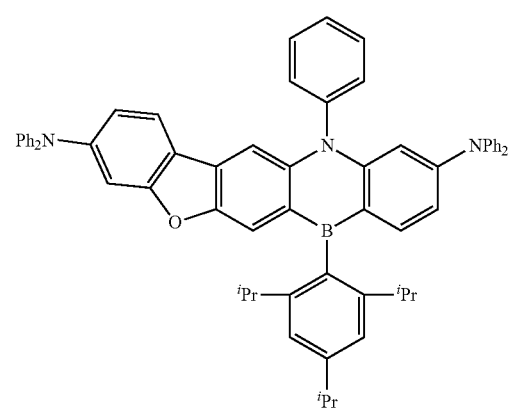

-continued

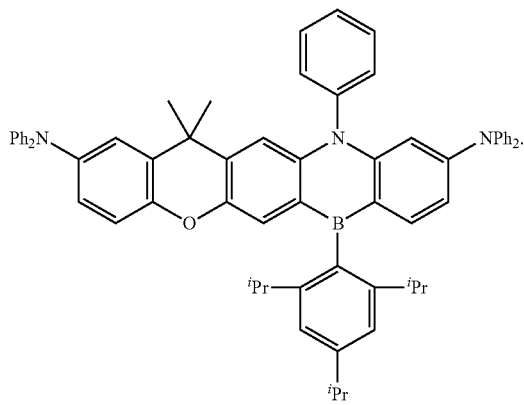

13. A polycyclic compound represented by Formula 1:

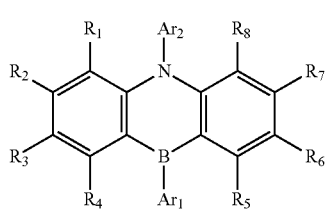

Formula 1 in Formula 1,
Ar₁ and Ar₂ are each independently a substituted or unsubstituted aryl ring having 6 to 30 carbon atoms for forming a ring, or a substituted or unsubstituted heteroaryl ring having 2 to 30 carbon atoms for forming a ring,
$R_1$ to $R_8$ are each independently a hydrogen atom, a deuterium atom, a halogen atom, a substituted or unsubstituted amino group, a cyano group, a boron group, a carbonyl group, a silyl group, an oxy group, a phosphine oxide group, a phosphine sulfide group, a substituted or unsubstituted thiol group, a sulfonyl group, a substituted or unsubstituted alkyl group having 1 to 20 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, or $R_1$ to $R_8$ are combined with each other to form a ring, and
at least two selected from $R_1$ to $R_8$ are represented by Formula 2:

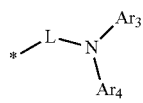

Formula 2 in Formula 2,
L is a direct bond, a substituted or unsubstituted arylene group having 6 to 30 carbon atoms for forming a ring, or a substituted or unsubstituted heteroarylene group having 2 to 30 carbon atoms for forming a ring, or is combined with an adjacent group to form a ring, and Ar₃ and Ar₄ are each independently a substituted or unsubstituted aryl group having 6 to 30 carbon atoms for forming a ring, or a substituted or unsubstituted heteroaryl group having 2 to 30 carbon atoms for forming a ring, or are combined with adjacent groups to form a ring.

14. The polycyclic compound of claim 13, wherein Ar₁ is represented by Formula 3:

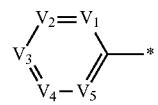

Formula 3 in Formula 3,
$V_1$ to $V_5$ are each independently N or $CR_9$,
wherein $R_9$ is a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 1 to 20 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, or is combined with an adjacent group to form a ring.

15. The polycyclic compound of claim 14,
wherein at least one selected from $V_1$ and $V_5$ in Formula 3 is $CR_{10}$, and
wherein $R_{10}$ is a substituted or unsubstituted alkyl group having 2 to 20 carbon atoms.

16. The polycyclic compound of claim 13, wherein the polycyclic compound represented by Formula 1 is a thermally activated delayed fluorescence material.

17. The polycyclic compound of claim 13, wherein Ar₃ is a substituted aryl group having 6 to 30 carbon atoms for forming a ring, or a substituted or unsubstituted heteroaryl group having 2 to 30 carbon atoms for forming a ring.

18. The polycyclic compound of claim 13,
wherein at least one selected from $R_1$ to $R_4$ in Formula 1 is represented by Formula 2, and at least one selected from $R_5$ to $R_8$ in Formula 1 is represented by Formula 2.

19. The polycyclic compound of claim 13, wherein Formula 1 is represented by Formula 4:

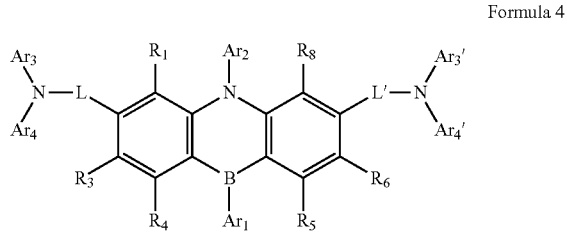

Formula 4

Compound Group 1 in Formula 4,

L' is a direct bond, a substituted or unsubstituted arylene group having 6 to 30 carbon atoms for forming a ring, or a substituted or unsubstituted heteroarylene group having 2 to 30 carbon atoms for forming a ring, $Ar_3'$ and $Ar_4'$ are each independently a substituted or unsubstituted aryl group having 6 to 30 carbon atoms for forming a ring, or a substituted or unsubstituted heteroaryl group having 2 to 30 carbon atoms for forming a ring, or are combined with adjacent groups to form a ring, and $Ar_1$ to $Ar_4$, $R_1$, $R_3$ to $R_6$, $R_8$, and L are the same as defined with respect to Formula 1 or Formula 2.

20. The polycyclic compound of claim 13, wherein the polycyclic compound represented by Formula 1 is any one selected from compounds represented by Compound Group 1:

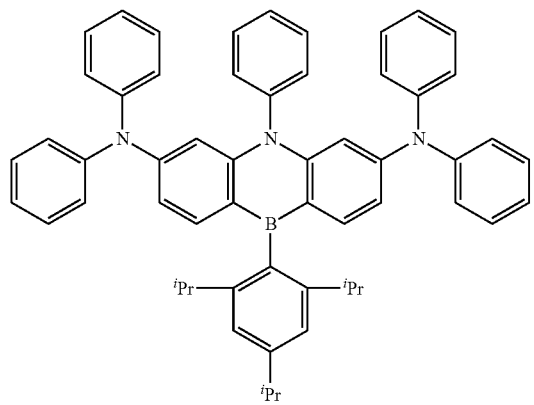

1

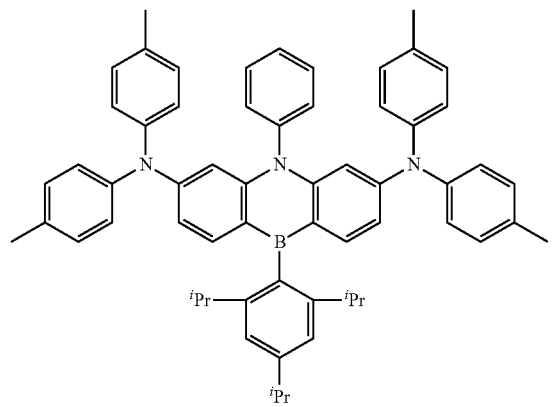

2

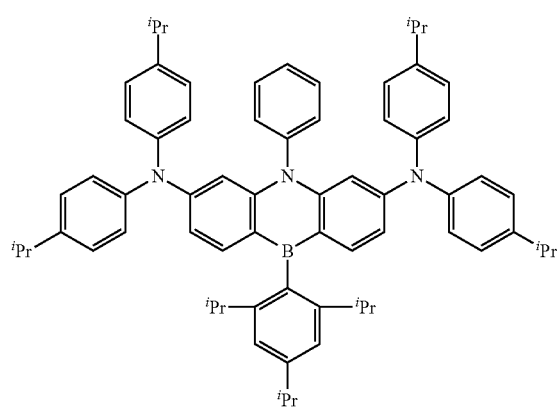

3

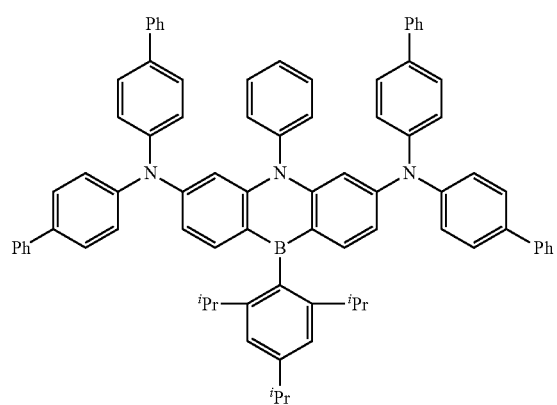

4

-continued
5
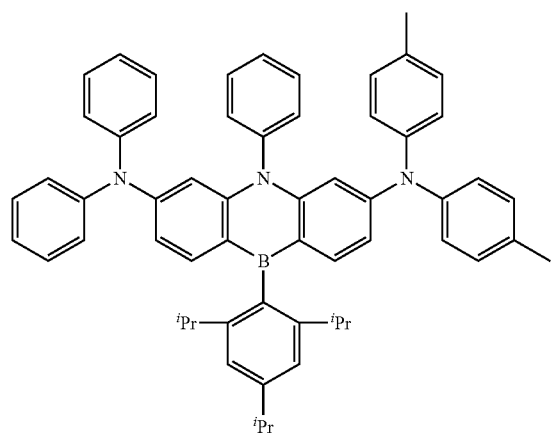
6
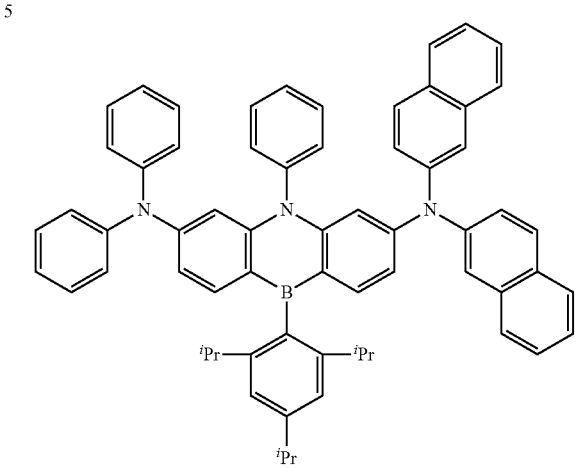
7
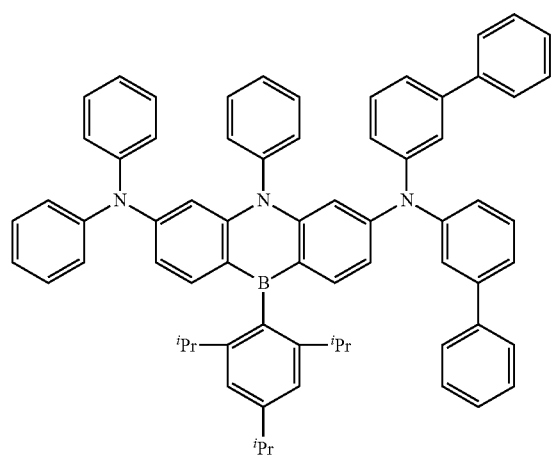
8
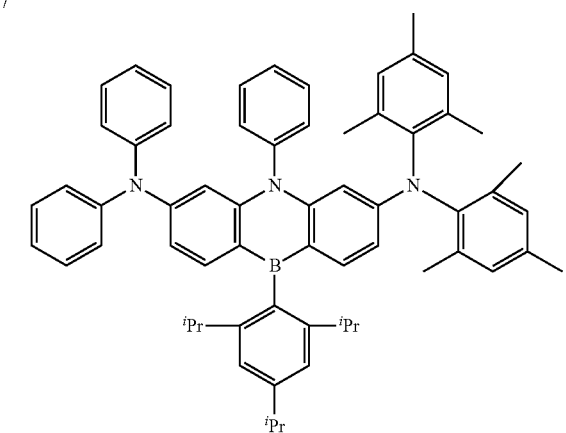
9
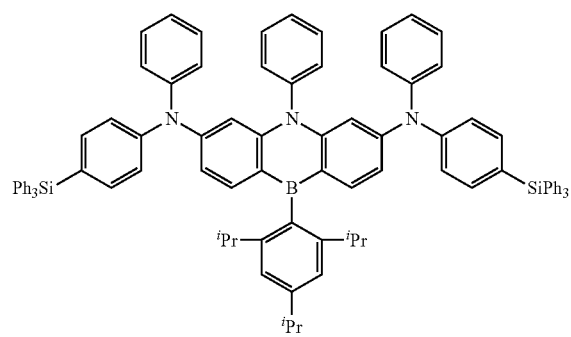
10
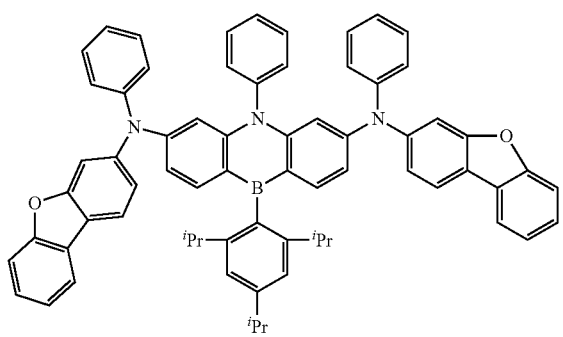
11
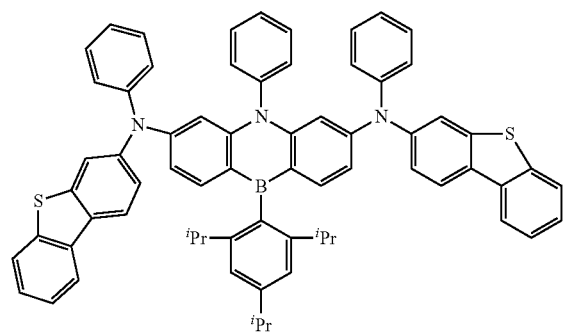
12
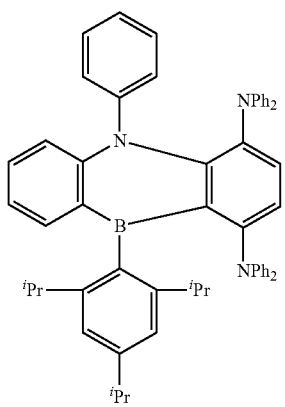

-continued
| 13 | 14 |
|---|---|
| 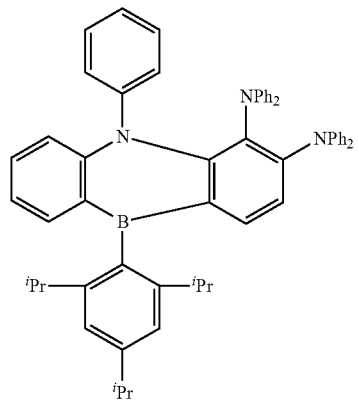 | 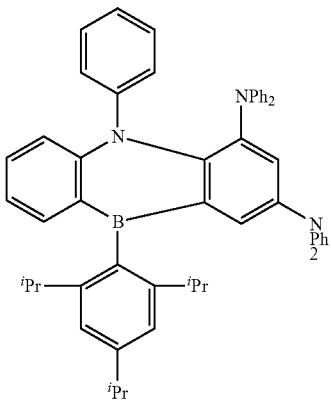 |
| 15 | 16 |
| 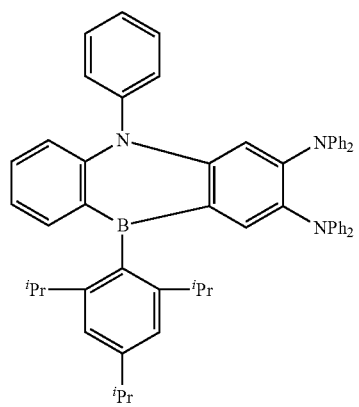 | 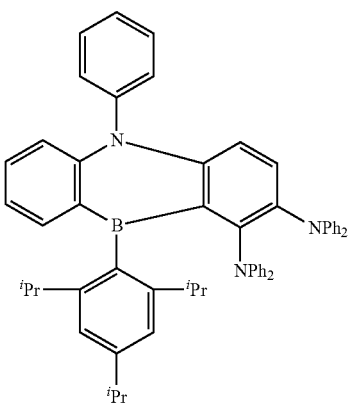 |
| 17 | 18 |
| 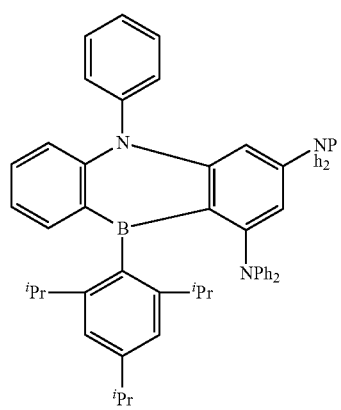 | 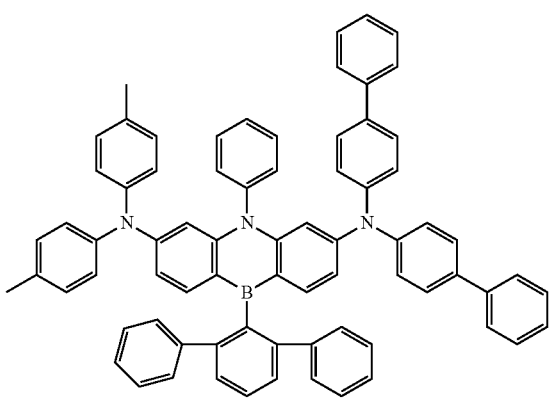 |
| 19 | 20 |
| 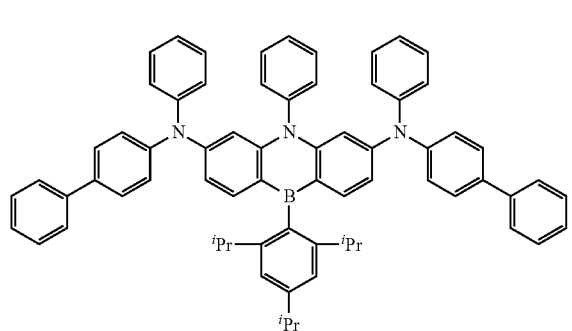 | 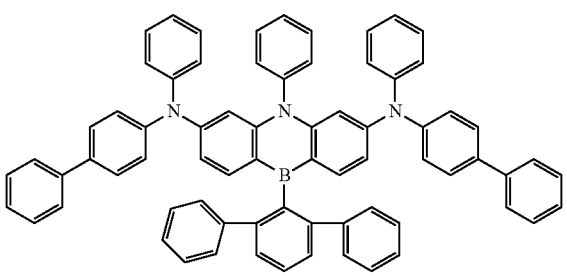 |

-continued
21
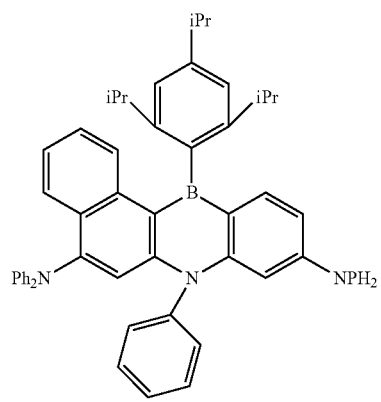
22
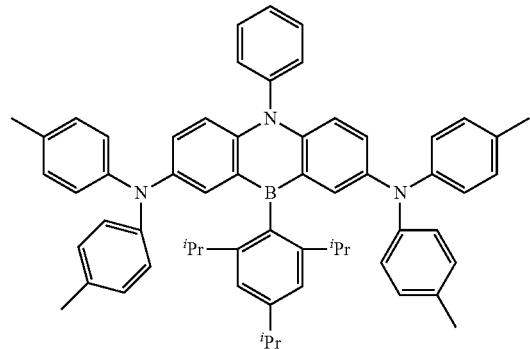
23
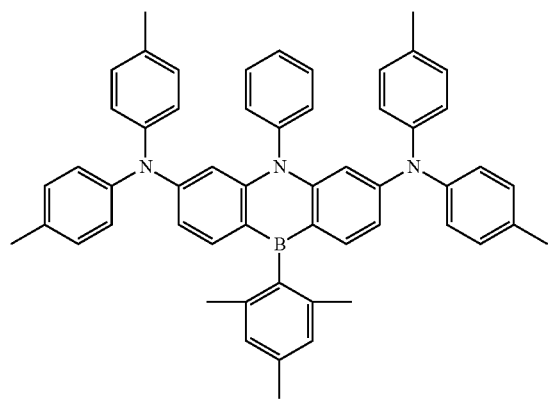
24
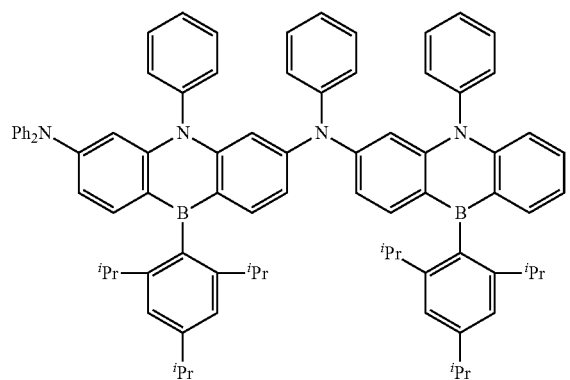
25
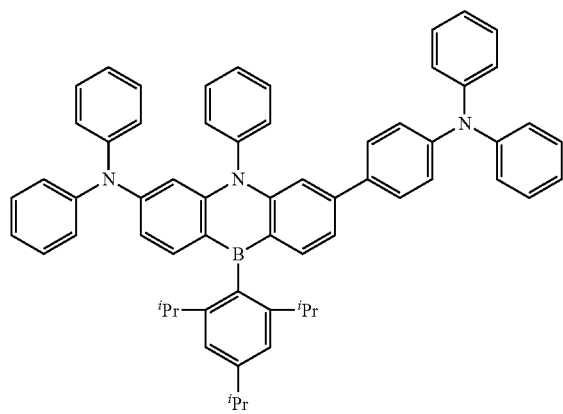
26
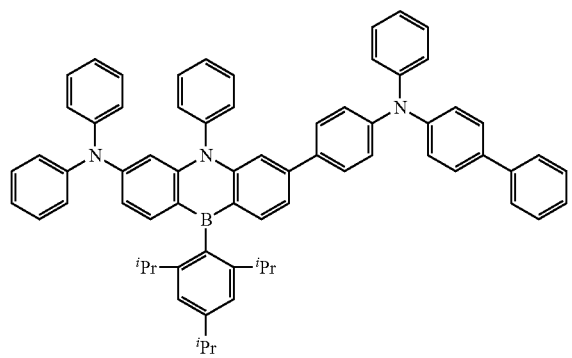
27
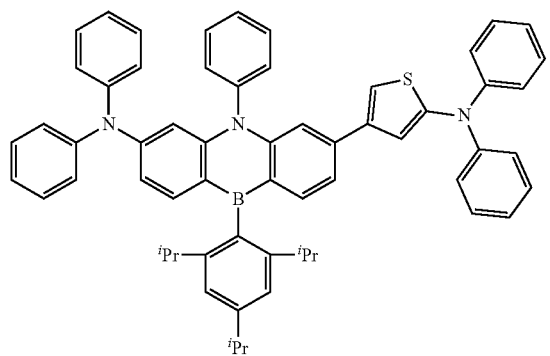
28
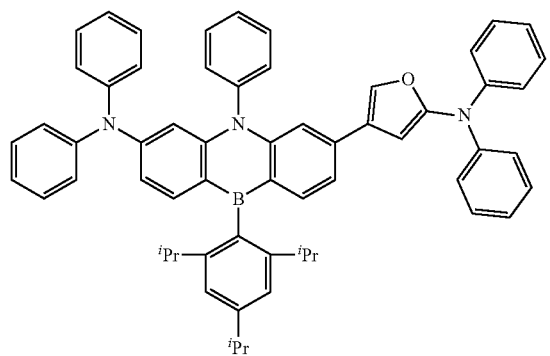

-continued
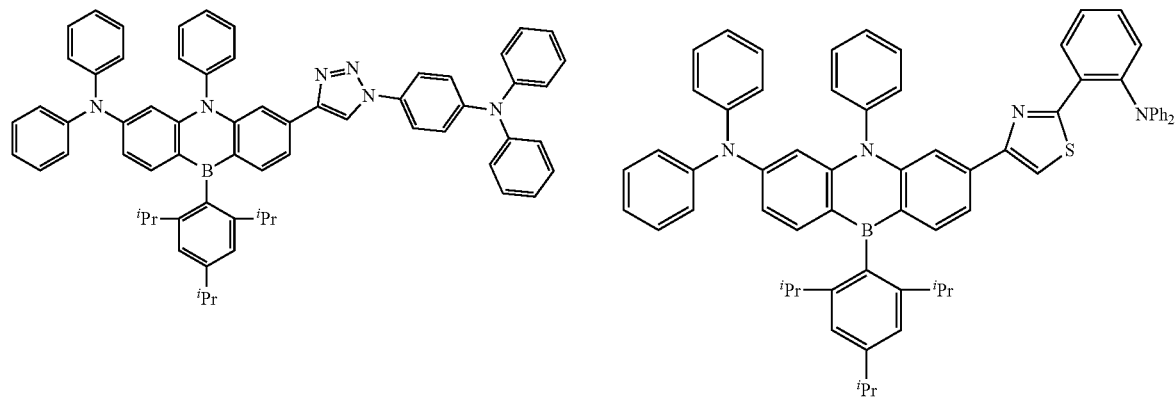
29
30
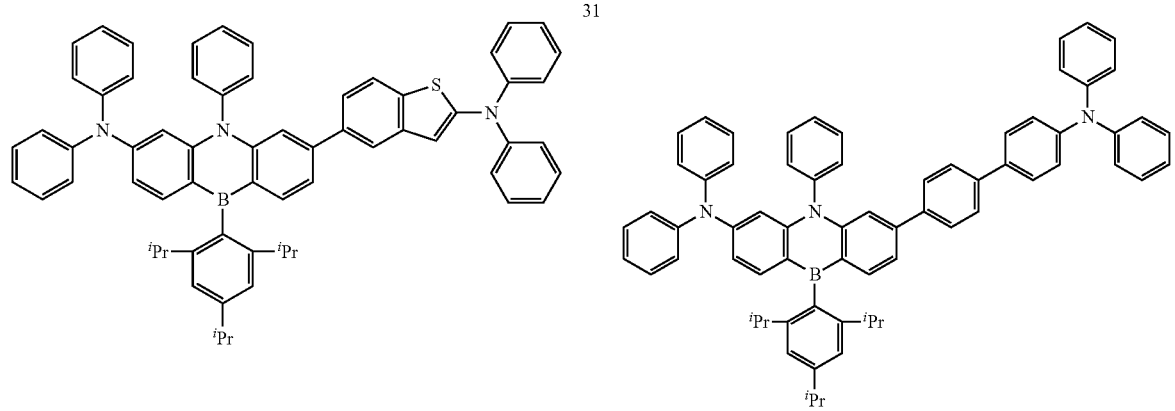
31
32
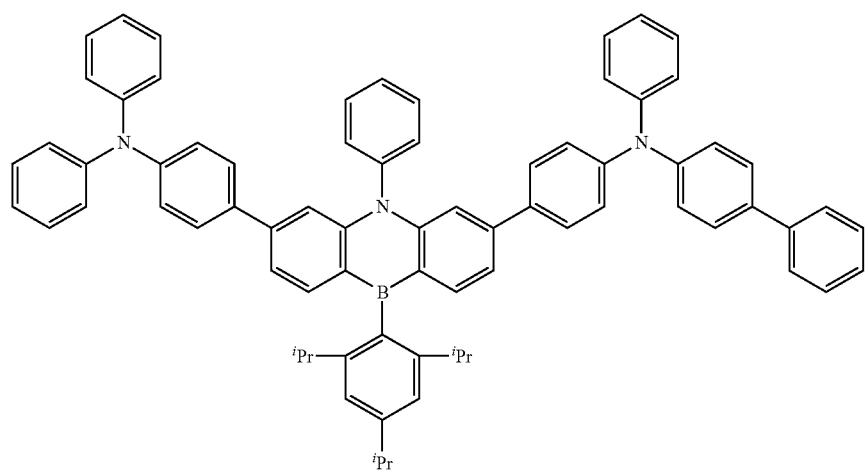
33

34
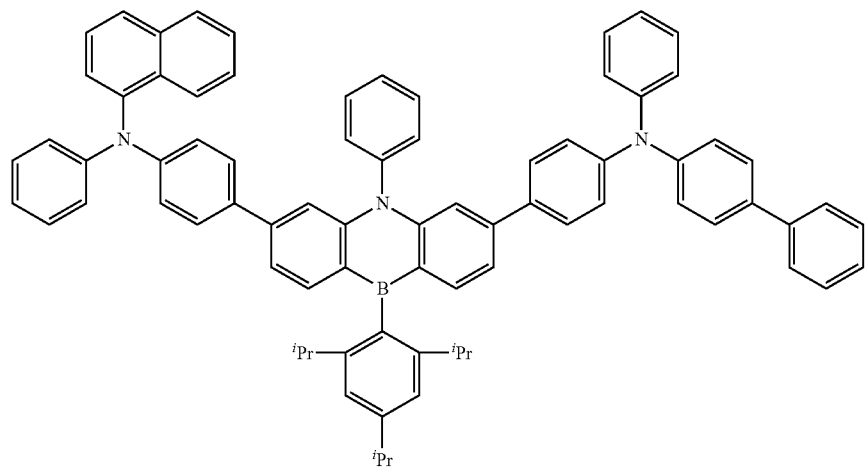
35
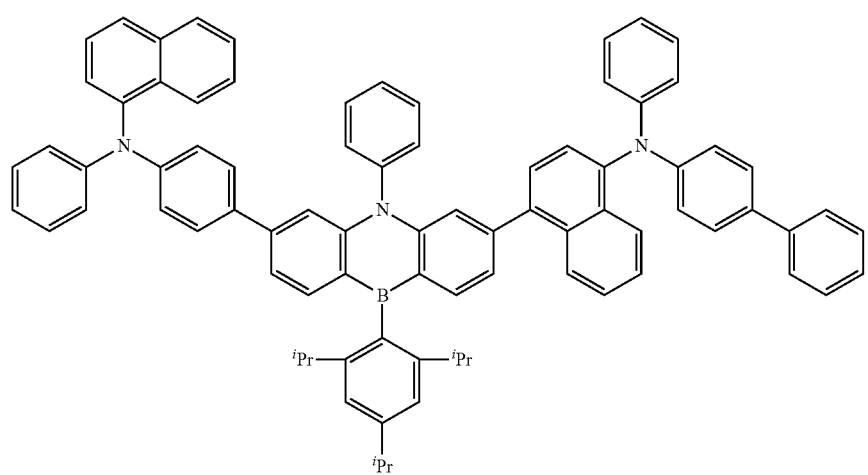
36
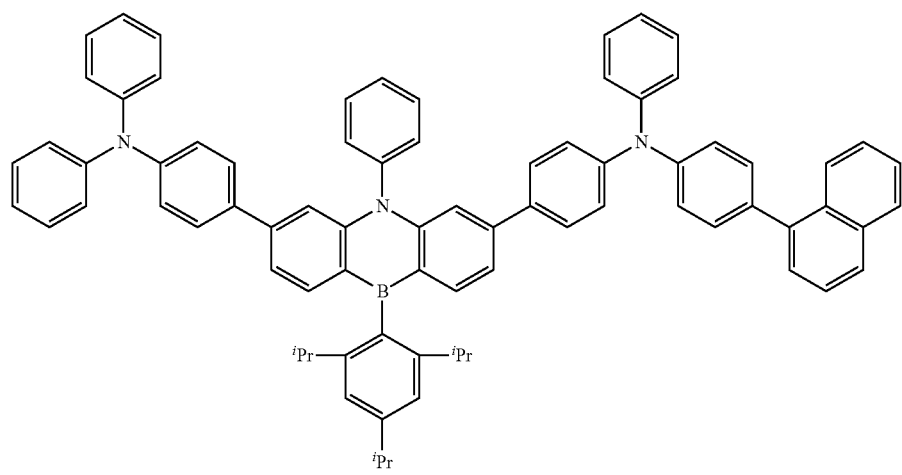

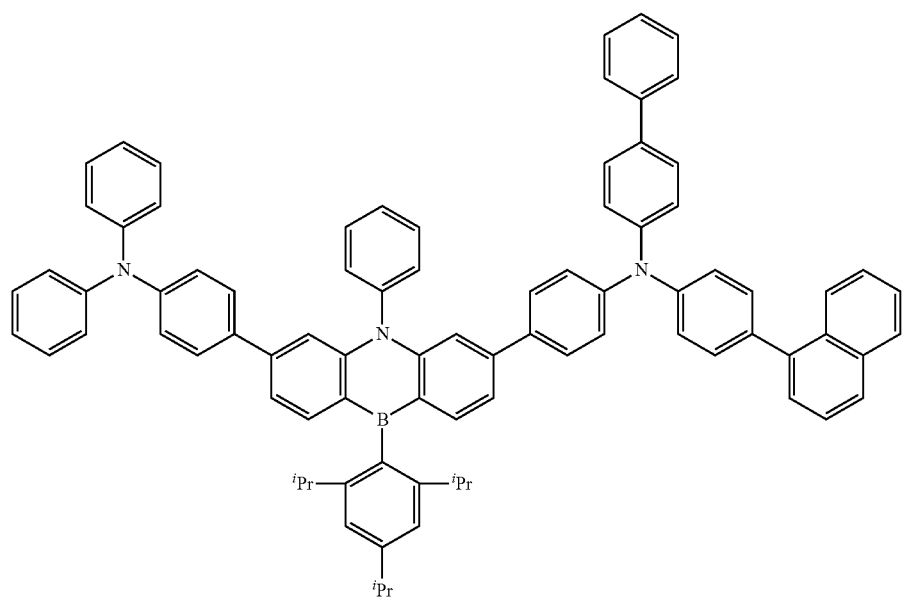
37
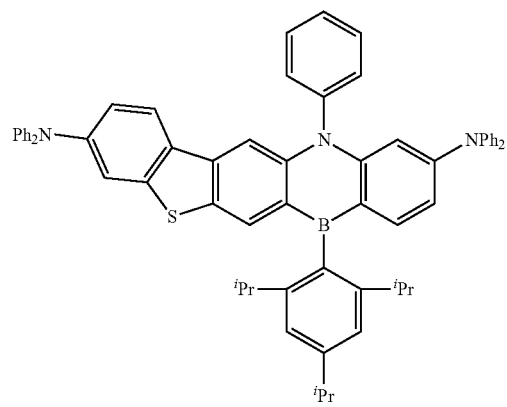
38
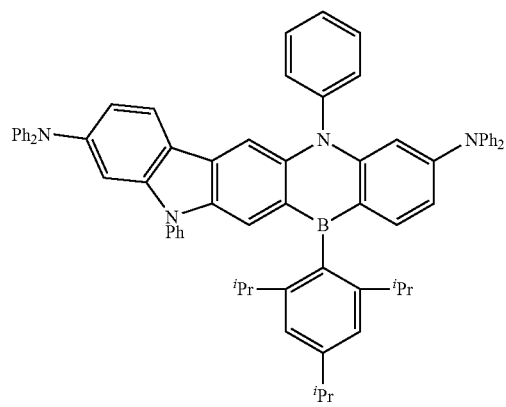
39
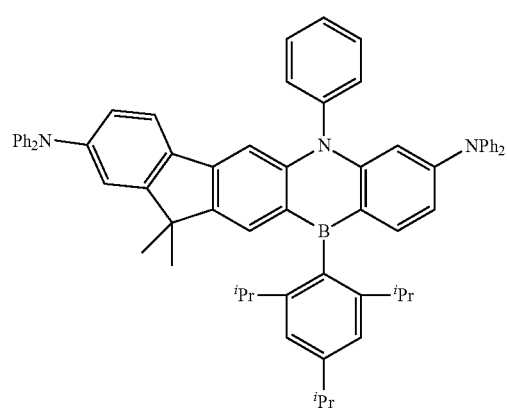
40
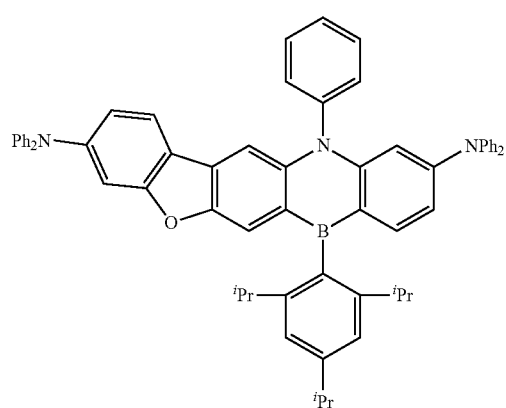
41

-continued
42
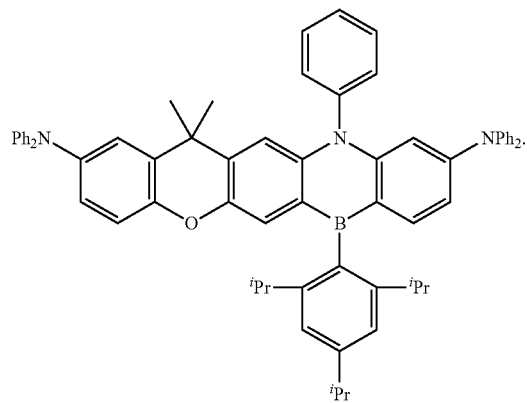
* * * * *